United States Patent
Yamamoto et al.

(10) Patent No.: US 10,720,221 B2
(45) Date of Patent: Jul. 21, 2020

(54) SEMICONDUCTOR STORAGE DEVICE AND MEMORY SYSTEM IN WHICH CONTROL CIRCUIT OF THE SEMICONDUCTOR STORAGE DEVICE EXECUTES CALIBRATION OPERATION ACCORDING TO TIMING AT WHICH DATA IS READ FROM ANOTHER SEMICONDUCTOR STORAGE DEVICE

(71) Applicant: TOSHIBA MEMORY CORPORATION, Tokyo (JP)

(72) Inventors: Kensuke Yamamoto, Yokohama Kanagawa (JP); Fumiya Watanabe, Yokohama Kanagawa (JP); Shouichi Ozaki, Komae Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 20 days.

(21) Appl. No.: 16/120,275

(22) Filed: Sep. 2, 2018

(65) Prior Publication Data
US 2019/0228826 A1   Jul. 25, 2019

(30) Foreign Application Priority Data
Jan. 25, 2018   (JP) .................. 2018-010660

(51) Int. Cl.
*G11C 16/30*      (2006.01)
*G06F 3/06*       (2006.01)
*G11C 7/10*       (2006.01)
*G11C 16/32*      (2006.01)
*G11C 16/08*      (2006.01)
(Continued)

(52) U.S. Cl.
CPC ............ *G11C 16/30* (2013.01); *G06F 3/0611* (2013.01); *G06F 3/0659* (2013.01); *G06F 3/0679* (2013.01); *G11C 7/109* (2013.01); *G11C 7/1063* (2013.01); *G11C 7/1066* (2013.01); *G11C 16/08* (2013.01); *G11C 16/32* (2013.01); *G11C 29/50012* (2013.01); *H03K 5/1565* (2013.01); *G11C 2207/2254* (2013.01)

(58) Field of Classification Search
CPC ......... G11C 7/109; G11C 16/30; G11C 16/32; G11C 29/028; G11C 16/08; G11C 29/023; G11C 2207/2254; G11C 29/50012; G11C 7/1063; G11C 7/1066; H03K 5/1565; G06F 3/0679; G06F 3/0611; G06F 3/0659
See application file for complete search history.

(56) References Cited

U.S. PATENT DOCUMENTS 5,572,158 A * 11/1996 Lee ................... H03K 5/086
                                                    327/170
6,314,530 B1   11/2001 Mann
(Continued)

FOREIGN PATENT DOCUMENTS

JP    2006-134334 A    5/2006
TW    201602900 A      1/2016

*Primary Examiner* — Gene N Auduong
(74) *Attorney, Agent, or Firm* — Kim & Stewart LLP

(57) ABSTRACT

A semiconductor storage device includes a first chip and a second chip each including a memory cell and configured to receive a same toggle signal. Upon receiving a first command, the first chip executes a first calibration operation to calibrate a duty ratio of an output signal generated in response to the toggle signal while data is read out from the second chip in response to the toggle signal.

20 Claims, 31 Drawing Sheets

(51) Int. Cl.
*H03K 5/156* (2006.01)
*G11C 29/50* (2006.01)

(56) References Cited

U.S. PATENT DOCUMENTS

| | | |
|---|---|---|
| 7,501,870 B2 | 3/2009 | Choi et al. |
| 7,525,359 B2 | 4/2009 | Kim |
| 8,947,931 B1 | 2/2015 | DAbreu |
| 9,871,021 B2 * | 1/2018 | Shim .................. G11C 5/04 |
| 10,103,129 B2 * | 10/2018 | Shim .................. G11C 5/04 |
| 10,211,841 B2 * | 2/2019 | Zerbe .................. H04L 7/0079 |
| 2012/0072650 A1 * | 3/2012 | Suzumura ............ G06F 13/1689 |
| | | 711/103 |
| 2014/0279759 A1 | 9/2014 | Yang et al. |
| 2017/0308328 A1 * | 10/2017 | Lim .................. G06F 3/061 |

\* cited by examiner

FIG. 21

| | DQ<3:0> | DQ<4> | DQ<5> | DQ<6> | DQ<7> |
|---|---|---|---|---|---|
| B0 | UNUSED | EXECUTE LONG-TERM DUTY-RATIO CALIBRATION OPERATION: 1 EXECUTE SHORT-TERM DUTY-RATIO CALIBRATION OPERATION: 0 | EXECUTE SECOND DUTY-RATIO CALIBRATION OPERATION: 1 NOT EXECUTE: 0 | EXECUTE DUTY-RATIO CALIBRATION OPERATION USING ANOTHER CIRCUIT (E.G., PLL): 1 NOT EXECUTE: 0 | EXECUTE FIRST DUTY-RATIO CALIBRATION OPERATION: 1 NOT EXECUTE: 0 |
| B1 | UNUSED | | | | |
| B2 | UNUSED | | | | | om
SEMICONDUCTOR STORAGE DEVICE AND MEMORY SYSTEM IN WHICH CONTROL CIRCUIT OF THE SEMICONDUCTOR STORAGE DEVICE EXECUTES CALIBRATION OPERATION ACCORDING TO TIMING AT WHICH DATA IS READ FROM ANOTHER SEMICONDUCTOR STORAGE DEVICE

CROSS-REFERENCE TO RELATED APPLICATION

This application is based upon and claims the benefit of priority from Japanese Patent Application No. 2018-010660, filed Jan. 25, 2018, the entire contents of which are incorporated herein by reference.

FIELD

Embodiments described herein relate generally to a semiconductor storage device and a memory system.

BACKGROUND

A memory system, which includes a NAND-type flash memory as a semiconductor storage device and a controller, which controls the NAND-type flash memory, is known.

DESCRIPTION OF THE DRAWINGS

FIG. 21 is a table for explaining setting related to the duty ratio calibration operation in the memory system according to the third embodiment.

DETAILED DESCRIPTION

Figure 1:
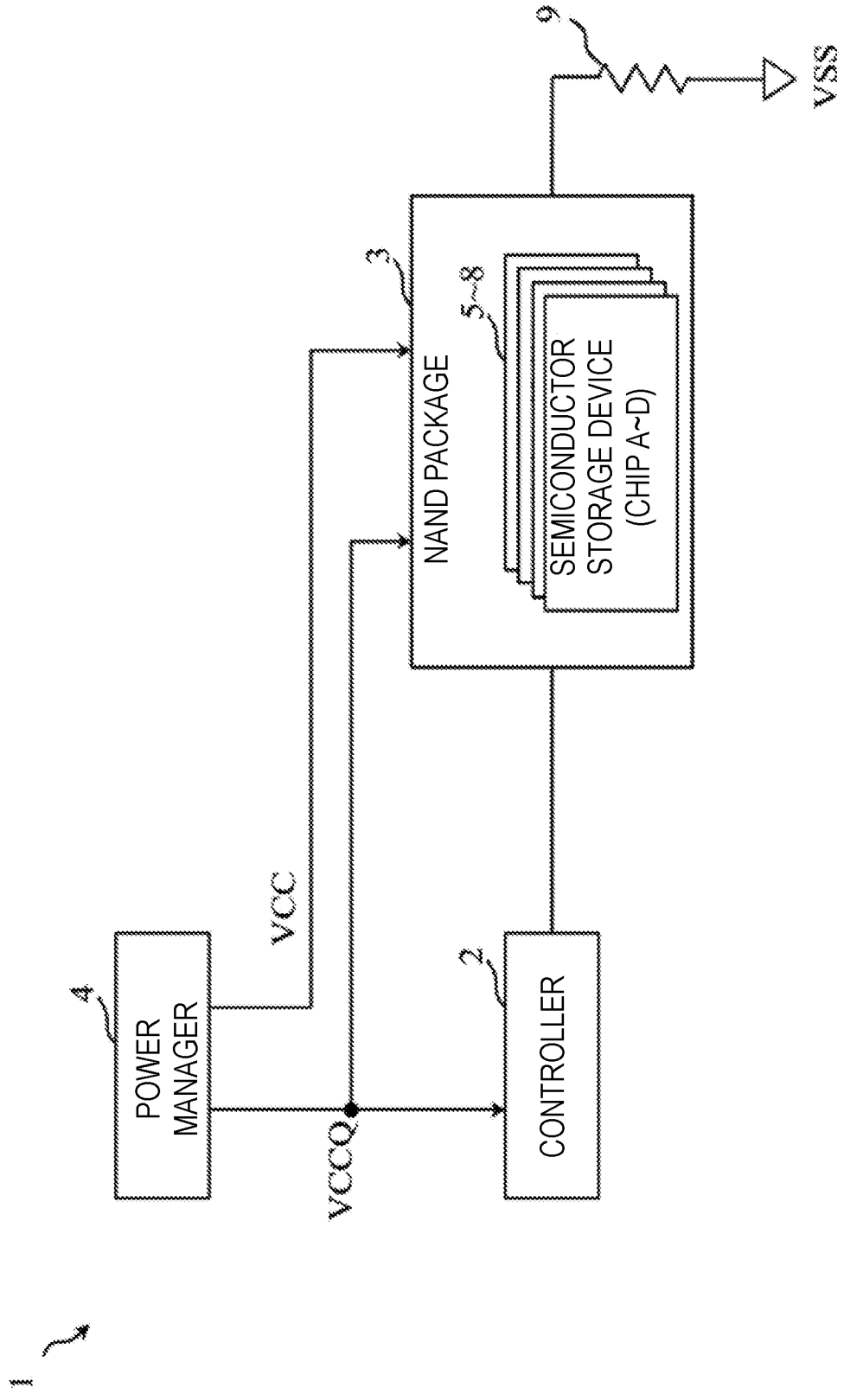
FIG. 1 is a block diagram of a power supply system of a memory system according to a first embodiment.

Embodiments provide a semiconductor storage device and a memory system in which an output signal is calibrated according to variation in duty ratio after a power supply is turned on.

In general, according to one embodiment, a semiconductor storage device includes a first chip and a second chip each including a memory cell and configured to receive a same toggle signal. Upon receiving a first command, the first chip executes a first calibration operation to calibrate a duty ratio of an output signal generated in response to the toggle signal while data is read out from the second chip in response to the toggle signal.

Hereinafter, embodiments will be described with reference to the drawings. Further, in the following description, the same reference numerals will be given to elements having the same functions and configurations.

Further, in the following description, signals X<n:0> ("n" is a natural number) are made up of (n+1)-bit signals, and mean a group of signals X<0>, X<1>, . . . , and X<n>, each of which is a 1-bit signal. In addition, elements Y<n:0> mean a group of elements Y<0>, Y<1>, . . . , and Y<n>, which correspond to the input or output of the signals X<n:0> in a one-to-one relationship.

In addition, in the following description, a signal /Z indicates the inverted signal of a signal Z. In addition, "the duty ratio of the signal Z and the signal /Z" indicates the ratio of the time from the rising edge to the falling edge of a pulse to one cycle of the pulse in the signal Z (which is equal to the ratio of the time from the falling edge to the rising edge of a pulse to one cycle of the pulse in the signal /Z).

1. First Embodiment

A memory system according to a first embodiment will be described. The memory system according to the first embodiment includes, for example, a NAND-type flash memory, which is a semiconductor storage device, and a memory controller, which controls the NAND-type flash memory.

1.1 About Configuration

1.1.1 About Overall Configuration of Memory System

The overall configuration of the memory system according to the first embodiment will be described with reference to FIGS. 1 and 2. The memory system 1 communicates with, for example, an external host device (not illustrated). The memory system 1 holds data from the host device, and allows the host device to read out data therein.

FIG. 1 is a block diagram of a power supply system of the memory system according to the first embodiment. As illustrated in FIG. 1, the memory system 1 includes a controller 2, a NAND package 3, a power manager 4, and a reference resistor 9. The NAND package 3 includes, for example, a plurality of semiconductor storage devices 5 to 8. In the example of FIG. 1, a case where four chips are provided in the NAND package 3 is illustrated. Further, in the following description, the semiconductor storage devices 5 to 8 may also be replaced with chips A to D, respectively.

The power manager 4 is an integrated circuit (IC) for managing the voltage to be supplied to the controller 2 and the NAND package 3. The power manager 4 supplies, for example, a voltage VCCQ to the controller 2 and the NAND package 3. The voltage VCCQ is used as a reference of the voltage that is used for an input/output signal between the controller 2 and the NAND package 3. In addition, the power manager 4 supplies, for example, a voltage VCC to the NAND package 3. The voltage VCC is used as a reference voltage of other voltages used in the NAND package 3.

In addition, the NAND package 3 is configured so as to be connectable to a voltage VSS via the reference resistor 9. The reference resistor 9 is used, for example, to calibrate the output impedance of each of the semiconductor storage devices 5 to 8 in the NAND package 3. The voltage VSS is a ground voltage, and is defined as, for example, ground (0 V) in the memory system 1.

Figure 2:
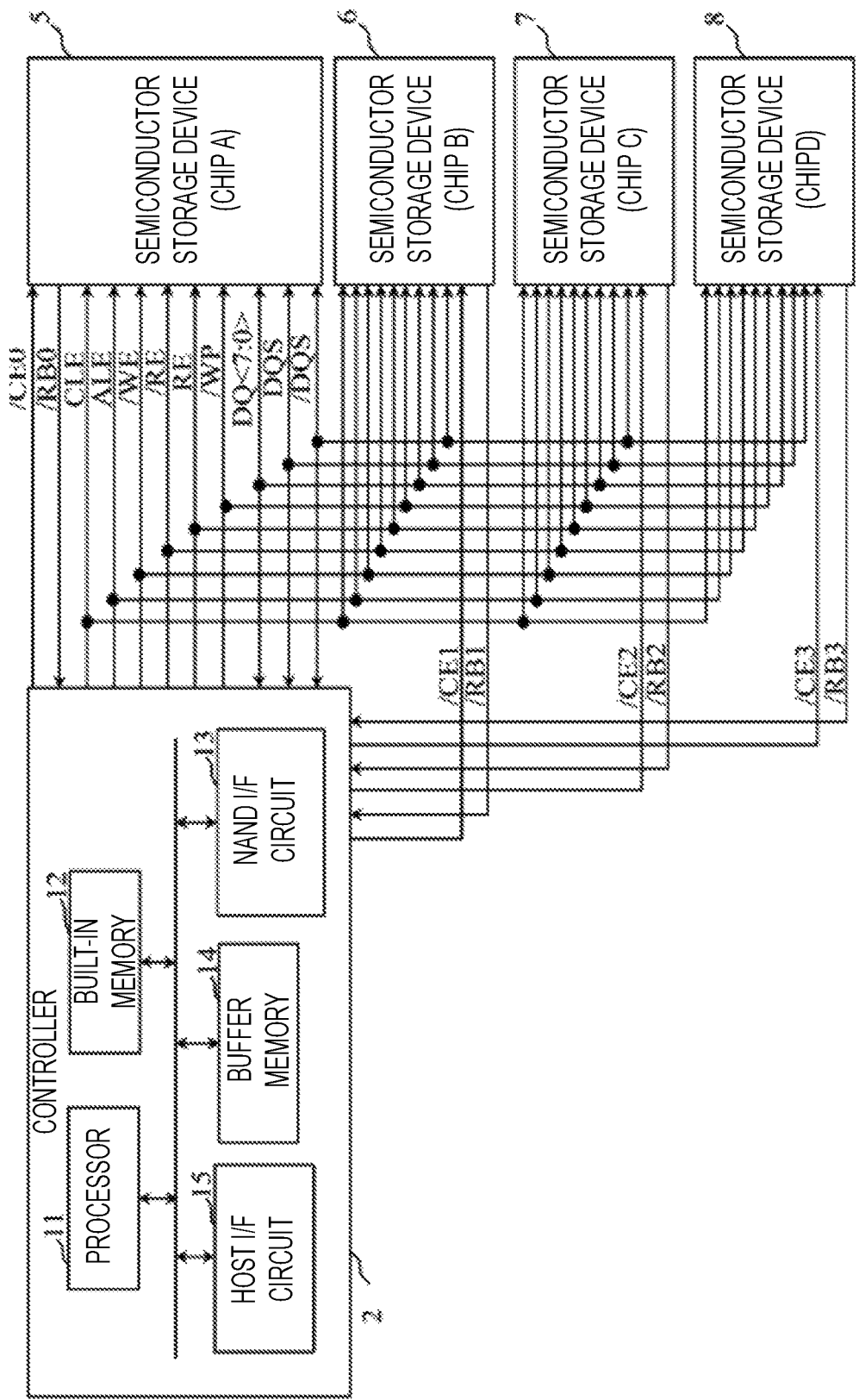
FIG. 2 is a block diagram of a signal system of the memory system according to the first embodiment.

FIG. 2 is a block diagram of a signal system of the memory system according to the first embodiment. As illustrated in FIG. 2, the controller 2 controls the semiconductor storage devices 5 to 8. Specifically, the controller 2 writes data in the semiconductor storage devices 5 to 8, and reads data from the semiconductor storage devices 5 to 8. The controller 2 is connected to the semiconductor storage devices 5 to 8 by a NAND bus.

Each of the semiconductor storage devices 5 to 8 includes a plurality of memory cells, and stores data in a nonvolatile manner. Each of the semiconductor storage devices 5 to 8 is, for example, a semiconductor chip, which may be uniquely identified by a chip address, which is assigned thereto in advance. The semiconductor storage devices 5 to 8 are configured so as to be operable independently of each other by an instruction of the controller 2.

The NAND bus, which is connected to the respective semiconductor storage devices 5 to 8, transmits and receives the same kind of signals. The NAND bus includes a plurality of signal lines, and performs transmission/reception of signals /CE0 to /CE3, CLE, ALE, /WE, RE, /RE, /WP, /RB0 to /RB3, DQ<7:0>, DQS, and /DQS according to the NAND interface standard. The signals CLE, ALE, /WE, RE, /RE, and /WP are received by the semiconductor storage devices 5 to 8, and the signals /RB0 to /RB3 are received by the controller 2. In addition, the signals /CE0 to /CE3 are received by the semiconductor storage devices 5 to 8, respectively.

The signals /CE0 to /CE3 are signals for enabling the semiconductor storage devices 5 to 8, respectively. The signal CLE notifies the semiconductor storage devices 5 to 8 that the signals DQ<7:0> flowing to the semiconductor storage devices 5 to 8 are commands while the signal CLE is at the "high (H)" level. The signal ALE notifies the semiconductor storage devices 5 to 8 that the signals DQ<7:0> flowing to the semiconductor storage devices 5 to 8 are addresses while the signal ALE is at the "H" level. The signal /WE instructs the semiconductor storage devices 5 to 8 to receive the signals DQ<7:0> flowing to the semiconductor storage devices 5 to 8 while the signal /WE is at the "low (L)" level. The signals RE and /RE instruct the semiconductor storage devices 5 to 8 to output the signals DQ<7:0>, and for example, are used to control the operation timing of the semiconductor storage devices 5 to 8 when outputting the signals DQ<7:0>. The signal /WP instructs the semiconductor storage devices 5 to 8 to prohibit data writing and erasing. The signals /RB0 to /RB3 respectively indicate whether the semiconductor storage devices 5 to 8 are in a ready state (a state of accepting a command from the outside) or in a busy state (a state of not accepting a command from the outside). The signals DQ<7:0> are, for example, 8-bit signals. The signals DQ<7:0> are transmitted and received between the semiconductor storage devices 5 to 8 and the controller 2, and include commands, addresses, and data. The signals DQS and /DQS may be generated, for example, based on the signals RE and /RE, and are used to control the operation timing of the semiconductor storage devices 5 to 8 in response to the signals DQ<7:0>.

1.1.2 About Configuration of Controller

Continuing with FIG. 2, the controller of the memory system according to the first embodiment will be described. The controller 2 includes a processor (central processing unit (CPU)) 11, a built-in memory (random access memory (RAM)) 12, a NAND interface circuit 13, a buffer memory 14, and a host interface circuit 15.

The processor 11 controls the overall operation of the controller 2. The processor 11 issues, for example, a write command based on an NAND interface to the semiconductor storage devices 5 to 8 in response to a write command of data received from the outside. This operation is also equally applied to other operations such as, for example, read, erasing and calibration operations.

The built-in memory 12 is, for example, a semiconductor memory such as, for example, dynamic RAM (DRAM), and is used as a work area of the processor 11. The built-in memory 12 holds, for example, firmware and various management tables for managing the semiconductor storage devices 5 to 8.

The NAND interface circuit 13 is connected to the semiconductor storage devices 5 to 8 via the above-described NAND bus, and is in charge of communication with the semiconductor storage devices 5 to 8. The NAND interface circuit 13 transmits commands, addresses, and write data to the semiconductor storage devices 5 to 8 in response to an instruction of the processor 11. In addition, the NAND interface circuit 13 receives statuses and read data from the semiconductor storage devices 5 to 8.

The buffer memory 14 temporarily holds, for example, data received by the controller 2 from the semiconductor storage devices 5 to 8 and the outside.

The host interface circuit 15 is connected to an external host device (not illustrated), and is in charge of communication with the host device. The host interface circuit 15 transfers, for example, commands and data, received from the host device, to the processor 11 and the buffer memory 14, respectively.

1.1.3 About Configuration of Semiconductor Storage Device

Next, the configuration of the semiconductor storage device according to the first embodiment will be described with reference to FIG. 3. Further, the semiconductor storage devices 5 to 8 have, for example, the same configuration. Therefore, in the following description, a configuration of the semiconductor storage device 5, among the semiconductor storage devices 5 to 8, will be described, and a description related to a configuration of the semiconductor storage devices 6 to 8 will be omitted.

Figure 3:
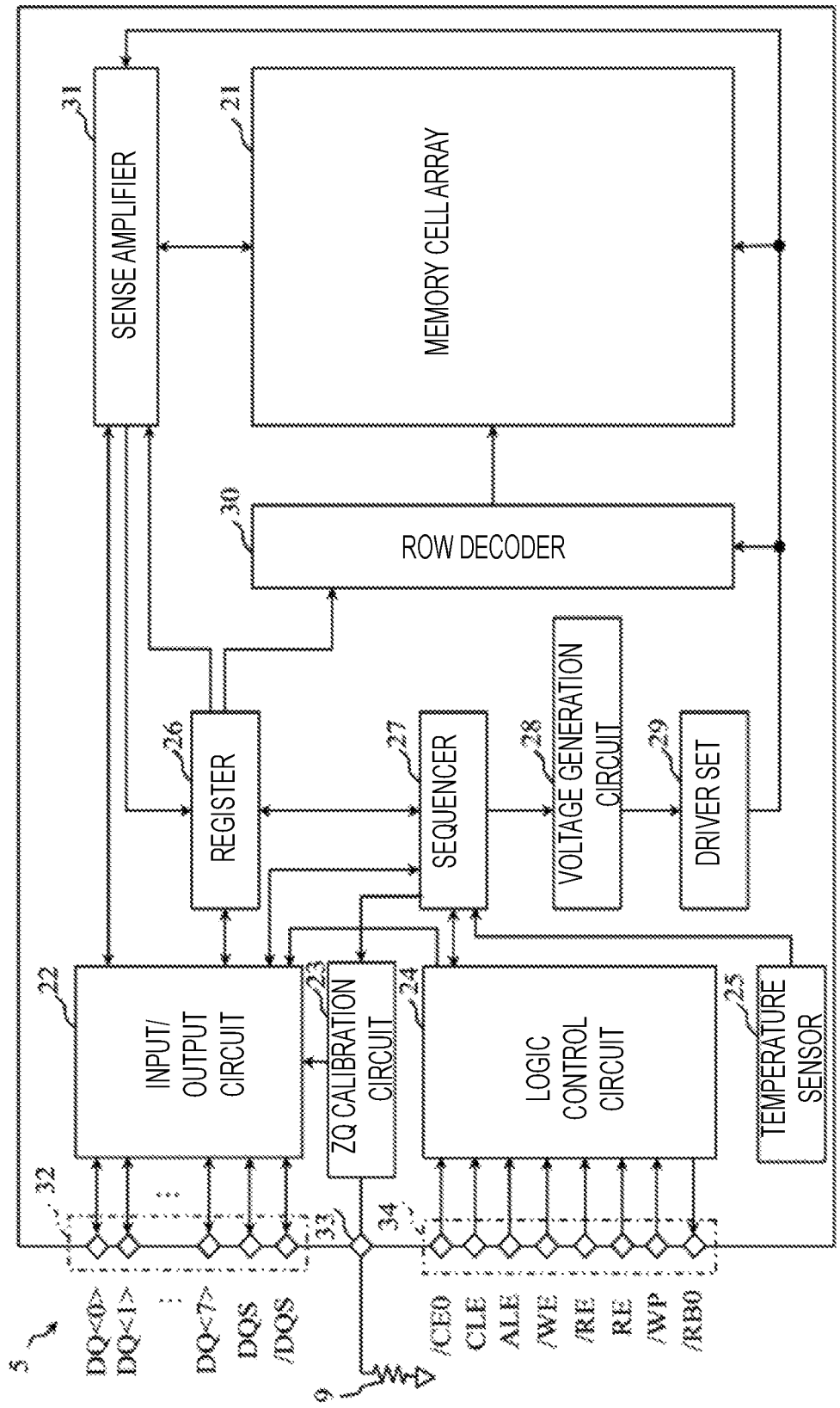
FIG. 3 is a block diagram of a semiconductor storage device according to the first embodiment.

As illustrated in FIG. 3, the semiconductor storage device 5 includes a memory cell array 21, an input/output circuit 22, a ZQ calibration circuit 23, a logic control circuit 24, a temperature sensor 25, a register 26, a sequencer 27, a voltage generation circuit 28, a driver set 29, a row decoder 30, a sense amplifier 31, an input/output pad group 32, a ZQ calibration pad 33, and a logic-control pad group 34.

The memory cell array 21 includes a plurality of non-volatile memory cells (not illustrated) associated with word lines and bit lines.

The input/output circuit 22 transmits and receives the signals DQ<7:0> to and from the controller 2. The input/output circuit 22 transfers commands and addresses in the signals DQ<7:0> to the register 26. The input/output circuit 22 transmits and receives write data and read data to and from the sense amplifier 31.

The ZQ calibration circuit 23 calibrates the output impedance of the semiconductor storage device 5 based on the reference resistor 9 via the ZQ calibration pad 33.

The logic control circuit 24 receives the signals /CE0, CLE, ALE, /WE, RE, /RE, and /WP from the controller 2. In addition, the logic control circuit 24 transfers the signal /RB0 to the controller 2 and notifies the state of the semiconductor storage device 5 to the outside.

The temperature sensor 25 measures the temperature inside the semiconductor storage device 5. The temperature sensor 25 sends information on the measured temperature to the sequencer 27. Further, the temperature sensor 25 may be provided at any position in the semiconductor storage device 5 in a range within which it may measure the temperature that may be regarded as the temperature of the memory cell array 21.

The register 26 holds commands and addresses. The register 26 transfers the addresses to the row decoder 30 and the sense amplifier 31, and transfers the commands to the sequencer 27.

The sequencer 27 receives the commands, and controls the entire semiconductor storage device 5 according to the sequence based on the received commands. In addition, the sequencer 27 sends information on the temperature, received from the temperature sensor 25, to the controller 2 via the input/output circuit 22.

The voltage generation circuit 28 generates voltages required for operations such as, for example, data writing, reading, and erasing based on an instruction from the sequencer 27. The voltage generation circuit 28 supplies the generated voltage to the driver set 29.

The driver set 29 includes a plurality of drivers, and supplies various voltages from the voltage generation circuit 28 to the row decoder 30 and the sense amplifier 31 based on the addresses from the register 26. The driver set 29 supplies various voltages to the row decoder 30 based on, for example, a row address among the addresses.

The row decoder 30 receives the row address, among the addresses, from the register 26, and selects the memory cells in the row based on the row address. Then, the voltages from the driver set 29 are transferred to the memory cells in the selected row via the row decoder 30.

At the time of reading data, the sense amplifier 31 senses read data that are read from the memory cells to the bit lines, and transfers the sensed read data to the input/output circuit 22. At the time of writing data, the sense amplifier 31 transfers write data via the bit lines to the memory cells. In addition, the sense amplifier 31 receives a column address, among the addresses, from the register 26, and outputs column data based on the column address.

The input/output pad group 32 transfers the signals DQ<7:0>, DQS, and /DQS, received from the controller 2, to the input/output circuit 22. In addition, the input/output pad group 32 transfers the signal DQ<7:0>, transmitted from the input/output circuit 22, to the outside of the semiconductor storage device 5.

The ZQ calibration pad 33 is connected at one end thereof to the reference resistor 9 and at the other end thereof to the ZQ calibration circuit 23.

The logic-control pad group 34 transfers the signals /CE0, CLE, ALE, /WE, RE, /RE, and /WP, received from the controller 2, to the logic control circuit 24. In addition, the logic-control pad group 34 transfers the signal /RB0, transmitted from the logic control circuit 24, to the outside of the semiconductor storage device 5.

1.1.4 about Configuration of Input/Output Circuit and Logic Control Circuit

Next, configurations of the input/output circuit and the logic control circuit of the semiconductor storage device according to the first embodiment will be described.

1.1.4.1 About Configuration Related to Duty Ratio Calibration Function

Figure 4:
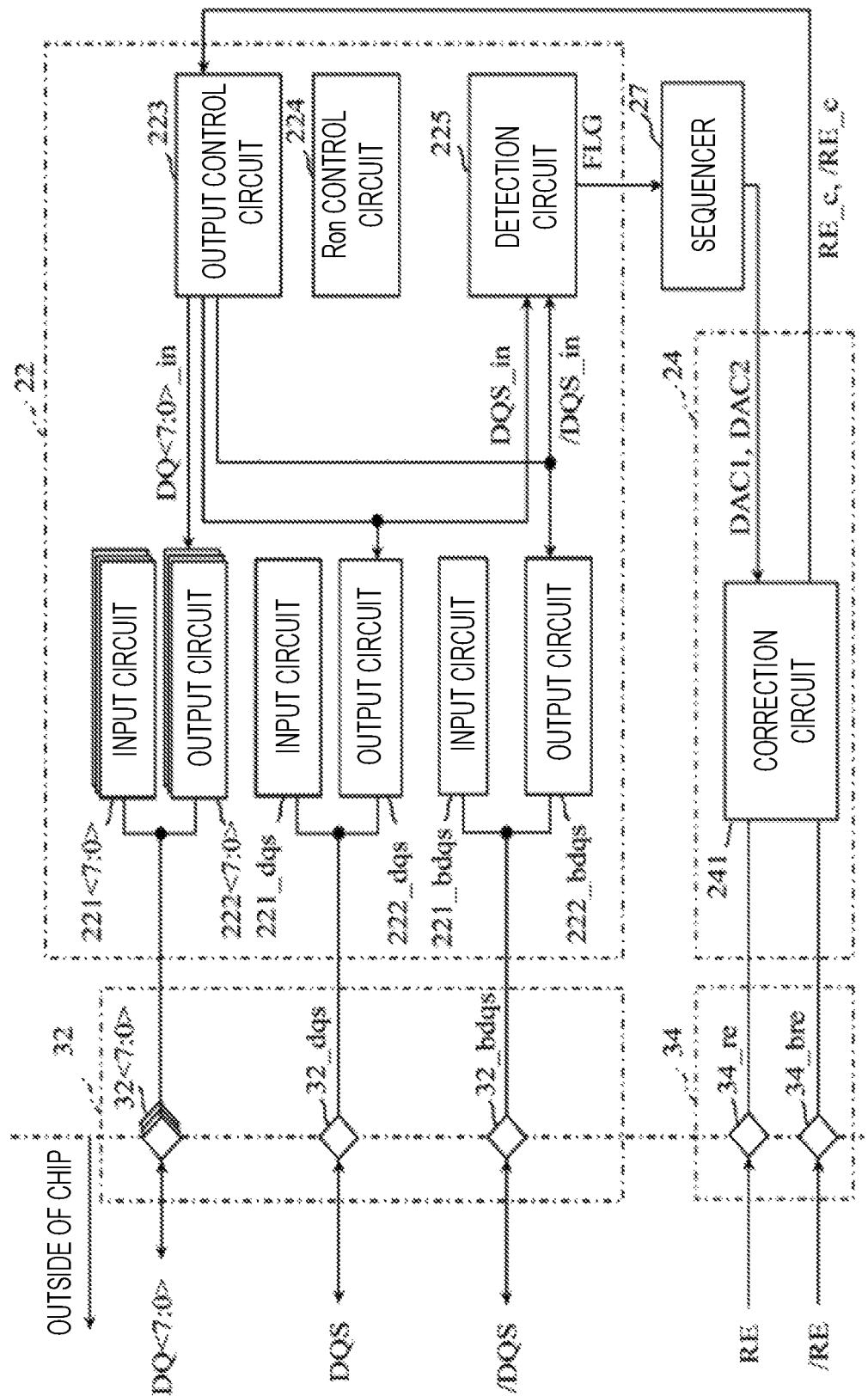
FIG. 4 is a block diagram of an input/output circuit and a logic control circuit of the semiconductor storage device according to the first embodiment.

Among the input/output circuit and the logic control circuit of the semiconductor storage device according to the first embodiment, a configuration related to a duty ratio calibration function will be described with reference to FIG. 4. FIG. 4 is a block diagram illustrating a duty ratio calibration function carried out by the input/output circuit and the logic control circuit of the semiconductor storage device according to the first embodiment.

As illustrated in FIG. 4, the input/output circuit 22 includes sets of input circuits 221<7:0> and output circuits 222<7:0>, which correspond to the signals DQ<7:0>. For example, the same kind of signal DQ<k> ($0 \leq k \leq 7$) is assigned to a set of an input circuit 221<k> and an output circuit 222<k>. That is, the set of the input circuit 221<k> and the output circuit 222<k> may communicate the signal DQ<k> with the external controller 2 via a pad 32<k> in the input/output pad group 32.

In addition, the input/output circuit 22 includes a set of an input circuit 221_*dqs* and an output circuit 222_*dqs*, which corresponds to the signal DQS. That is, the set of the input circuit 221_*dqs* and the output circuit 222_*dqs* may communicate the signal DQS with the external controller 2 via a pad 32_*dqs* in the input/output pad group 32. In addition, the input/output circuit 22 includes a set of an input circuit 221 bdqs and an output circuit 222_*bdqs*, which corresponds to the signal /DQS. That is, the set of the input circuit 221 bdqs and the output circuit 222_*bdqs* may communicate the signal /DQS with the external controller 2 via a pad 32_*bdqs* in the input/output pad group 32.

The input/output circuit 22 further includes an output control circuit 223, a Ron control circuit 224, and a detection circuit 225. The output control circuit 223 generates signals DQ<7:0> in, DQS_in, and /DQS_in, and sends the same to output circuits 222<7:0>, 222_*dqs*, and 222_*bdqs*, respectively. The Ron control circuit 224 controls the output impedances in the output circuits 222<7:0>, 222_*dqs*, and 222_*bdqs*.

The detection circuit 225 detects the duty ratio of the signals DQS_in and /DQS_in by monitoring the signals DQS_in and /DQS_in sent from the output control circuit 223. The detection circuit 225 generates a signal FLG, which indicates whether or not calibration of the duty ratio is necessary, based on the detection result, and sends the same to the sequencer 27.

The sequencer 27 generates control signals DAC1 and DAC2 based on the signal FLG upon receiving the signal FLG from the detection circuit 225, and sends the same to the logic control circuit 24.

The logic control circuit 24 includes a correction circuit 241. The correction circuit 241 corrects the duty ratio of the signals RE and /RE, which are input respectively via pads 34_*re* and 34_*bre* in the logic-control pad group 34. The correction circuit 241 corrects the duty ratio of the signals RE and /RE based on the control signals DAC1 and DAC2 from the sequencer 27, and generates signals RE_c and /RE_c. The signals RE_c and /RE_c are sent to the output control circuit 223, for example, and are used as the basis of the timing of toggling of the signals DQS and /DQS generated in the output control circuit 223. More specifically, the duty ratio of the signals DQS and /DQS is determined according to the duty ratio of the signals RE_c and /RE_c. For example, the duty ratio of the signals DQS and /DQS is the same as or correlates with the duty ratio of the signals RE_c and /RE_c.

Further, in the example of FIG. 4, a case where the signals RE_c and /RE_c are directly sent from the correction circuit 241 to the output control circuit 223 is illustrated, but the disclosure is not limited thereto. For example, after the correction circuit 241 sends the signals RE_c and /RE_c to another circuit (e.g., the sequencer 27), a timing signal based on the duty ratio of the signals RE_c and /RE_c may be generated in the other circuit. Then, when the timing signal is sent to the output control circuit 223, the signals DQS_in and /DQS_in, correlated with the duty ratio of the signals RE_c and /RE_c, may be generated.

With the configuration as described above, the detection circuit 225 may detect that the duty ratio of the signals DQS_in and /DQS_in deviates from a desired value, and the duty ratio of the signals RE and /RE may be corrected by the correction circuit 241 based on the detection result. Then, when the correction result is fed back to the output control circuit 223, the duty ratio of the signals DQS_in and /DQS_in may be calibrated and, in turn, the signals DQS and /DQS having a desired duty value may be output.

1.1.4.2 About Configuration of Correction Circuit

Figure 5:
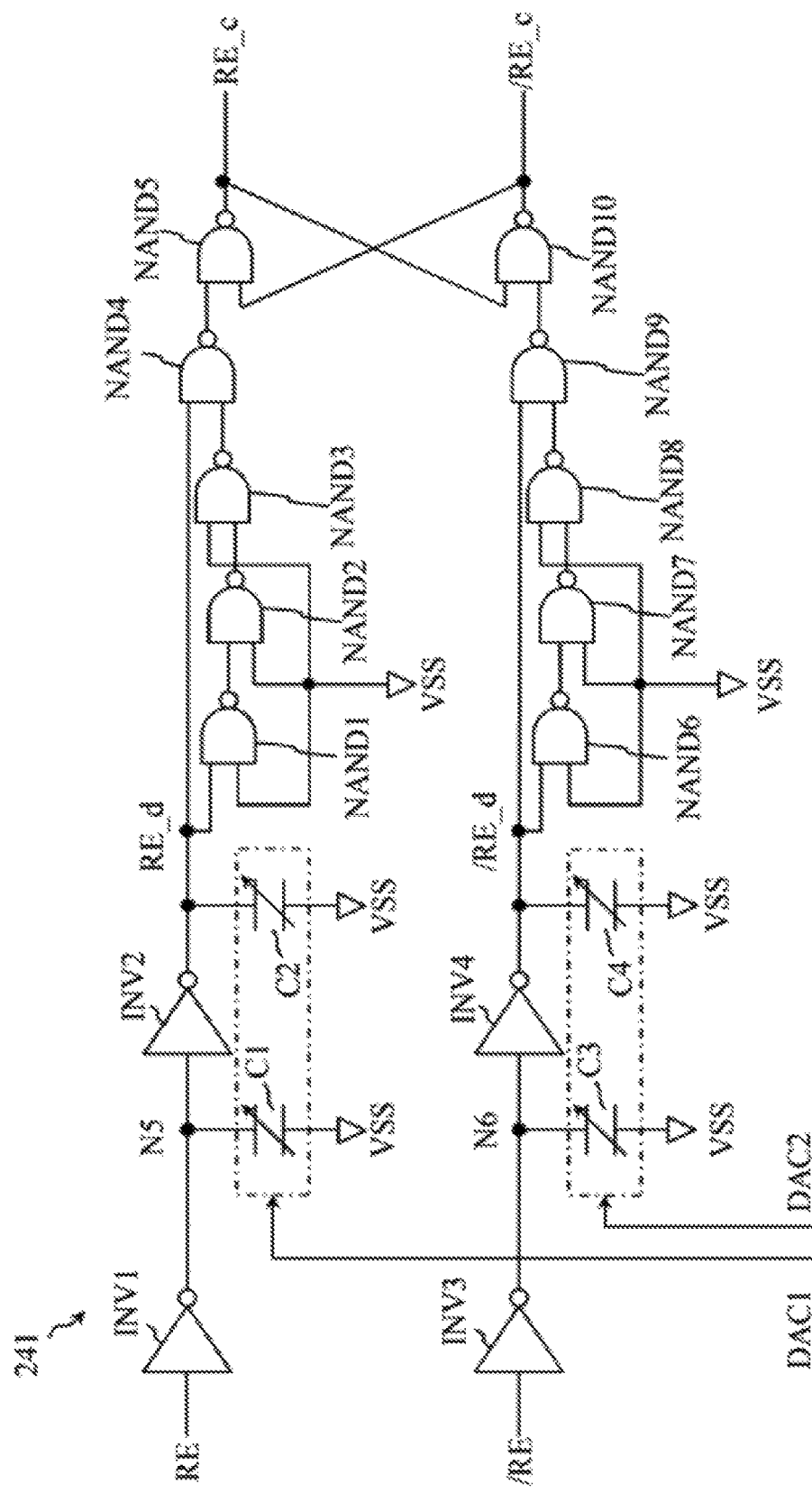
FIG. 5 is a circuit diagram of a correction circuit of the semiconductor storage device according to the first embodiment.

Among the input/output circuit according to the first embodiment, details of a configuration of the correction circuit will be described with reference to FIG. 5. FIG. 5 is a circuit diagram of the correction circuit of the semiconductor storage device according to the first embodiment.

As illustrated in FIG. 5, the correction circuit 241 includes inverters INV1, INV2, INV3, and INV4, variable capacitors C1, C2, C3, and C4, and logic circuits NAND1, NAND2, NAND3, NAND4, NAND5, NAND6, NAND7, NAND8, NAND9, and NAND10.

The inverter INV1 includes an input terminal, to which the signal RE is input, and an output terminal connected to a node N5. The inverter INV2 includes an input terminal connected to the node N5 and an output terminal connected to a node RE_d.

The variable capacitor C1 includes a first terminal connected to the node N5 and a second terminal, to which the voltage VSS is supplied. The variable capacitor C2 includes a first terminal connected to the node RE_d and a second terminal, to which the voltage VSS is supplied. The variable capacitors C1 and C2 are configured in a manner such that the capacitances thereof may be changed based on the control signal DAC1 sent from the sequencer 27. More specifically, for example, each of the variable capacitors C1 and C2 may include a plurality of sets (not illustrated) of capacitors and switches connected in series, and may be configured in a manner such that the plurality of sets are connected in parallel. The control signal DAC1 is a signal that may set, for example, any number of switches in the variable capacitors C1 and C2 to an ON state or an OFF state. With the configuration as described above, the variable capacitors C1 and C2 may change their capacitances stepwise within a certain range in response to the control signal DAC1. That is, a signal, which is delayed by a certain amount, is supplied to the node RE_d according to the set capacitances of the variable capacitors C1 and C2.

The inverter INV3 includes an input terminal, to which the signal /RE is input, and an output terminal connected to a node N6. The inverter INV4 includes an input terminal connected to the node N6 and an output terminal connected to a node /RE_d.

The variable capacitor C3 includes a first terminal connected to the node N6 and a second terminal, to which the voltage VSS is supplied. The variable capacitor C4 includes a first terminal connected to the node /RE_d and a second terminal, to which the voltage VSS is supplied. The variable capacitors C3 and C4 are configured in a manner such that the capacitances thereof may be changed based on the control signal DAC2 sent from the sequencer 27. More specifically, for example, each of the variable capacitors C3 and C4 may include a plurality of sets (not illustrated) of capacitors and switches connected in series, and may be configured in a manner such that the plurality of sets are connected in parallel. The control signal DAC2 is a signal that may set, for example, any number of switches in the variable capacitors C3 and C4 to an ON state or an OFF state. With the configuration as described above, the variable capacitors C3 and C4 may change their capacitances stepwise within a certain range in response to the control signal DAC2. That is, a signal, which is delayed by a certain amount, is supplied to the node /RE_d according to the set capacitances of the variable capacitors C3 and C4.

In addition, the control signals DAC1 and DAC2 may be set independently of each other. Therefore, the amount of delay from the signal RE in the node RE_d and the amount of delay from the signal /RE in the node /RE_d are controlled independently of each other. Therefore, signals, one of which is delayed by an arbitrary time with respect to the other one, may be supplied to the nodes RE_d and /RE_d in response to the control signals DAC1 and DAC2.

The logic circuits NAND1 to NAND10 output the NAND operation results of two input signals.

The logic circuit NAND1 includes a first input terminal connected to the node RE_d, a second input terminal, to which the voltage VSS is supplied, and an output terminal connected to a first input terminal of the logic circuit NAND2. The logic circuit NAND2 includes a second input terminal, to which the voltage VSS is supplied, and an output terminal connected to a first input terminal of the logic circuit NAND3. The logic circuit NAND 3 includes a second input terminal, to which the voltage VSS is supplied, and an output terminal connected to a first input terminal of the logic circuit NAND4. The logic circuit NAND4 includes a second input terminal connected to the node RE_d and an output terminal connected to a first input terminal of the logic circuit NAND5. The logic circuit NAND5 includes a second input terminal connected to a node /RE_c and an output terminal connected to a node RE_c.

The logic circuit NAND6 includes a first input terminal connected to the node /RE_d, a second input terminal, to which the voltage VSS is supplied, and an output terminal connected to a first input terminal of the logic circuit NAND7. The logic circuit NAND7 includes a second input terminal, to which the voltage VSS is supplied, and an output terminal connected to a first input terminal of the logic circuit NAND8. The logic circuit NAND8 includes a second input terminal, to which the voltage VSS is supplied, and an output terminal connected to a first input terminal of the logic circuit NAND9. The logic circuit NAND9 includes a second input terminal connected to the node /RE_d and an output terminal connected to a first input terminal of the logic circuit NAND10. The logic circuit NAND10 includes a second input terminal connected to the node RE_c and an output terminal connected to the node /RE_c.

The logic circuits NAND5 and NAND10 constitute a reset/set (RS) flip-flop circuit. Thereby, the voltage level of the node RE_c changes from the "L" level to the "H" level or from the "H" level to the "L" level at the timing when the voltage levels of the nodes RE_d and /RE_d change from the "L" level to the "H" level. That is, the node RE_c outputs a signal, the voltage level of which changes according to the rising edge of a pulse in the nodes RE_d and /RE_d. In addition, the node /RE_c outputs an inverted signal of the node RE_c.

1.1.4.3 About Details of Configuration of Output Circuit

Figure 6:
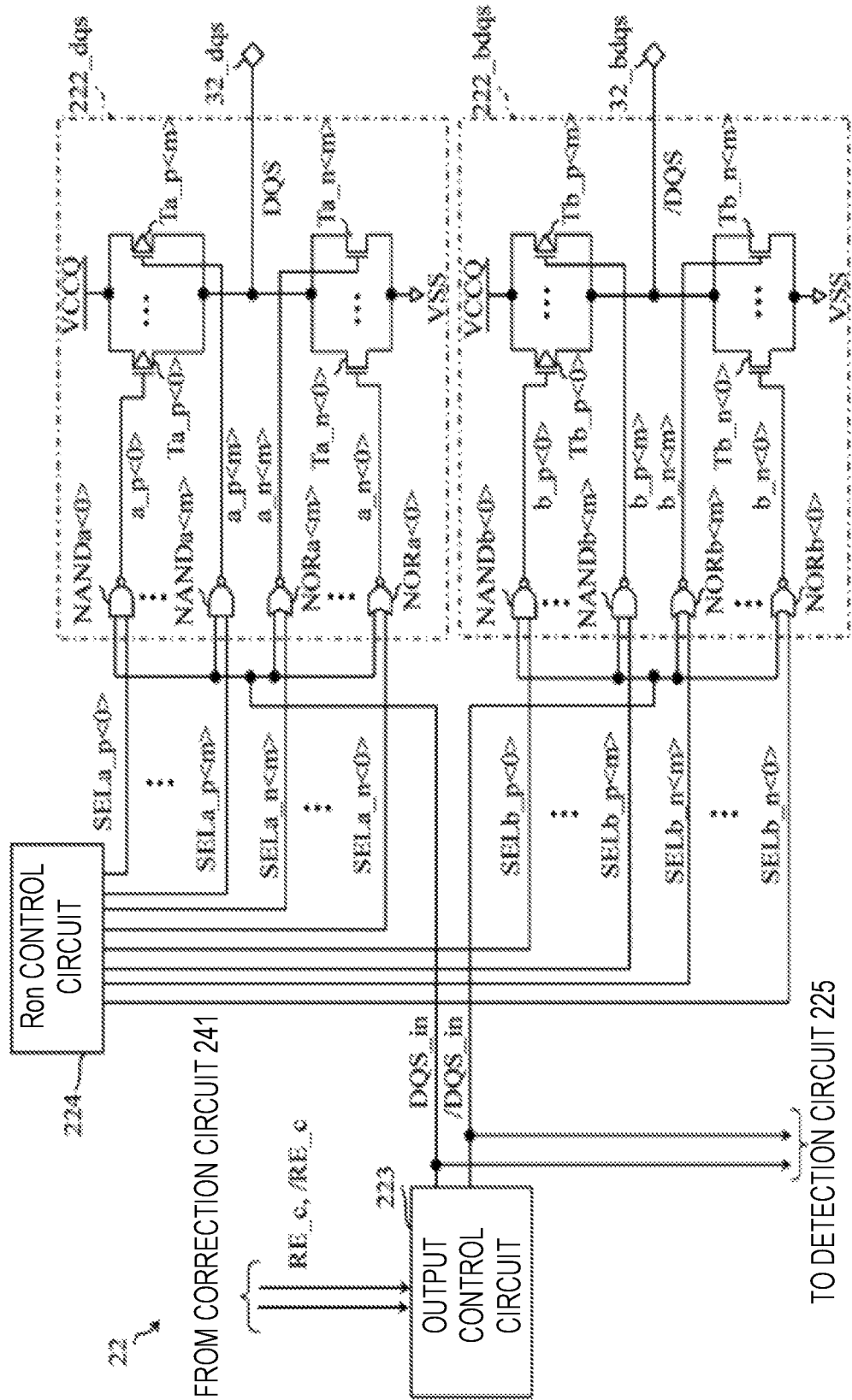
FIG. 6 is a circuit diagram of an output circuit of the semiconductor storage device according to the first embodiment.

Next, details of a configuration of the output circuits of the input/output circuit according to the first embodiment will be described with reference to FIG. 6. FIG. 6 is a circuit diagram of the output circuits of the semiconductor storage device according to the first embodiment. FIG. 6 illustrates a connection relationship between the output circuits 222_dqs and 222_bdqs, the output control circuit 223, the Ron control circuit 224, and the pads 32_dqs and 32_bdqs.

As illustrated in FIG. 6, the output circuit 222_dqs includes logic circuits NANDa<m:0> and NORa<m:0> and the transistors Ta_p<m:0> and Ta_n<m:0>. In addition, the output circuit 222_bdqs includes logic circuits NANDb<m: 0> and NORb<m:0> and the transistors Tb_p<m:0> and Tb_n<m:0>. Here, "m" is a natural number.

The logic circuits NANDa<m:0> and NANDb<m:0> output the NAND operation results of two input signals. The logic circuits NORa<m:0> and NORb<m:0> output the NOR operation results of two input signals. The transistors Ta_p<m:0> and Tb_p<m: 0> have a p-type polarity, and the transistors Ta_n<m:0> and Tb_n<m:0> have an n-type polarity.

As described above, the output control circuit 223 sends the signals DQS_in and /DQS_in, which are generated based on the duty ratio of the signals RE_c and /RE_c sent from the correction circuit 241. In addition, the Ron control circuit 224 sends signals SELa_p<m:0> and SELa_n<m:0> and signals SELb_p<m:0> and SELb_n<m:0>.

First, a configuration of the output circuit 222_dqs will be described.

The logic circuits NANDa<m:0> include first input terminals, to which the signal DQS_in is supplied in common, and second input terminals, to which the signals SELa_p<m: 0> are supplied, respectively. In addition, outputs of the logic circuits NANDa<m:0> are connected to gates of the transistors Ta_p<m:0>, respectively.

The transistors Ta_p<m:0> include first terminals, to which the voltage VCCQ is supplied in common, and second terminals, which are connected to the pad 32_dqs_in common.

The logic circuits NORa<m:0> include first input terminals, to which the signal DQS_in is supplied in common, and second input terminals, to which the signals SELa_n<m:0> are supplied, respectively. In addition, outputs of the logic circuits NORa<m:0> are connected to gates of the transistors Ta_n<m:0>, respectively.

The transistors Ta_n<m:0> include first terminals, to which the voltage VSS is supplied in common, and second terminals, which are connected to the pad 32_dqs_in common.

With the configuration as described above, when the signal DQS_in is at the "H" level, the output circuit 222_dqs may set the combined resistance of the transistors, which are selected such that the ON resistance is obtained by the signals SELa_p<m:0>, among the transistors Ta_p<m:0> to the output impedance on the pull-up side of the signal DQS. In addition, when the signal DQS_in is at the "L" level, the output circuit 222_dqs sets the combined resistance of the transistors, which are selected such that the ON resistance is obtained by the signals SELa_n<m: 0>, among the transistors Ta_n<m:0> to the output impedance on the pull-down side of the signal DQS.

Next, a configuration of the output circuit 222_bdqs will be described.

The logic circuits NANDb<m:0> include first input terminals, to which the signal /DQS_in is supplied in common, and second input terminals, to which the signals SELb_p<m:0> are supplied, respectively. In addition, outputs of the logic circuits NANDb<m:0> are connected to gates of the transistors Tb_p<m:0>, respectively.

The transistors Tb_p<m:0> include first terminals, to which the voltage VCCQ is supplied in common, and second terminals, which are connected to the pad 32_*bdqs* in common.

The logic circuits NORb<m:0> include first input terminals, to which the signal /DQS_in is supplied in common, and second input terminals, to which the signals SELb_n<m:0> are supplied, respectively. In addition, outputs of the logic circuits NORb<m:0> are connected to gates of the transistors Tb_n<m:0>, respectively.

The transistors Tb_n<m:0> include first terminals, to which the voltage VSS is supplied in common, and second terminals, which are connected to the pad 32_*bdqs* in common.

With the configuration as described above, when the signal /DQS_in is at the "H" level, the output circuit 222_*bdqs* may set the combined resistance of the transistors, which are selected such that the ON resistance is obtained by the signals SELb_p<m:0>, among the transistors Tb_p<m:0> to the output impedance on the pull-up side of the signal /DQS_In addition, when the signal /DQS_in is at the "L" level, the output circuit 222_*bdqs* may set the combined resistance of the transistors, which are selected such that the ON resistance is obtained by the signals SELb_n<m:0>, among the transistors Tb_n<m:0> to the output impedance on the pull-down side of the signal /DQS.

As described above, the output circuits 222_*dqs* and 222_*bdqs* generate the signals DQS and /DQS based on the signals DQS_in and /DQS_in. Therefore, when the duty ratio of the signals DQS_in and /DQS_in is not properly set, there is a possibility that the duty ratio of the signals DQS and /DQS may not be properly set. Therefore, the detection circuit 225 monitors the signals DQS_in and /DQS_in in order to detect whether or not the duty ratio of the signals DQS_in and /DQS_in is properly set.

1.1.4.4 About Configuration of Detection Circuit

Figure 7:
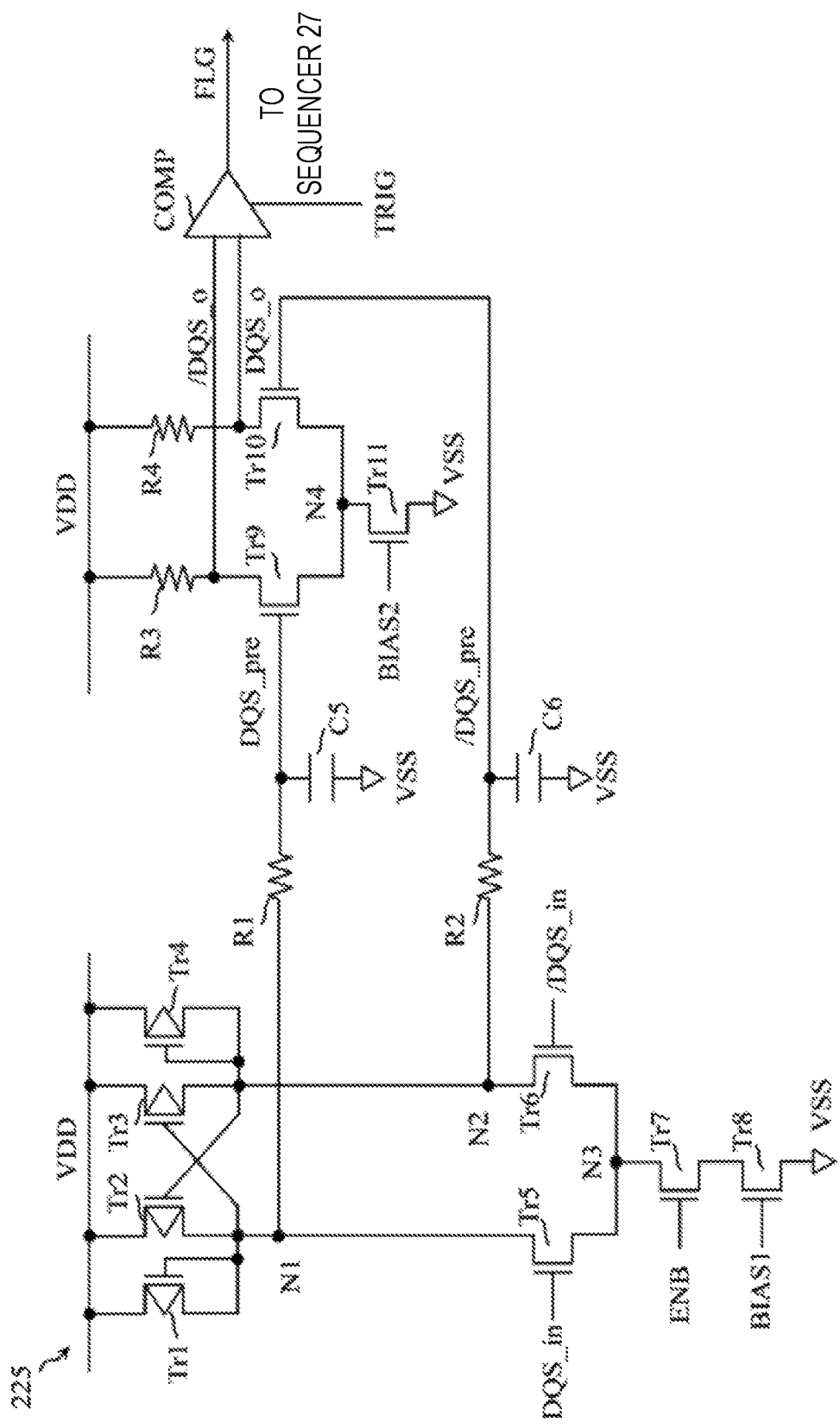
FIG. 7 is a circuit diagram of a detection circuit of the semiconductor storage device according to the first embodiment.

Next, a configuration of the detection circuit of the input/output circuit according to the first embodiment will be described with reference to FIG. 7. FIG. 7 is a circuit diagram of the detection circuit of the semiconductor storage device according to the first embodiment.

As illustrated in FIG. 7, the detection circuit 225 includes transistors Tr1, Tr2, Tr3, Tr4, Tr5, Tr6, Tr7, Tr8, Tr9, Tr10, and Tr11, resistors R1, R2, R3, and R4, capacitors C5 and C6, and a comparator COMP. For example, the transistors Tr1 to Tr4 have a p-type polarity, and the transistors Tr5 to Tr11 have an n-type polarity.

The transistor Tr1 includes a first terminal, to which the voltage VDD is supplied, a second terminal connected to a node N1, and its gate. The voltage VDD is a power supply having a predetermined value, and has a voltage level ("H" level) that may turn on the transistors Tr1 to Tr11. In addition, the voltage VDD/2 has a voltage level ("L" level) that may turn off the transistors Tr1 to Tr11. The transistor Tr2 includes a first terminal, to which the voltage VDD is supplied, a second terminal connected to a node N1, and a gate connected to a node N2. The transistor Tr3 includes a first terminal, to which the voltage VDD is supplied, a second terminal connected to the node N2, and a gate connected to the node N1. The transistor Tr4 includes a first terminal, to which the voltage VDD is supplied, a second terminal connected to the node N2, and its gate.

The transistor Tr5 includes a first terminal connected to the node N1, a second terminal connected to a node N3, and a gate, to which the signal DQS_in is supplied. The transistor Tr6 includes a first terminal connected to the node N2, a second terminal connected to the node N3, and a gate, to which the signal /DQS_in is supplied. The transistor Tr7 includes a first terminal connected to the node N3, a second terminal connected to a first terminal of the transistor Tr8, and a gate, to which a signal ENB is supplied. The transistor Tr8 includes a second terminal, to which the voltage VSS is supplied, and a gate, to which a signal BIAS1 is supplied.

The resistor R1 includes a first terminal connected to the node N1 and a second terminal connected to a node DQS_pre. The capacitor C5 includes a first terminal connected to the node DQS_pre and a second terminal, to which the voltage VSS is supplied.

The resistor R2 includes a first terminal connected to the node N2 and a second terminal connected to a node /DQS_pre. The capacitor C6 includes a first terminal connected to the node /DQS_pre and a second terminal, to which the voltage VSS is supplied.

With the configuration as described above, it is possible to set the voltages of the nodes DQS_pre and /DQS_pre to the "H" level or the "L" level according to the duty ratio of the signals DQS_in and /DQS_in. Specifically, when the duty ratio of the signals DQS_in and /DQS_in is greater than 50%, the nodes DQS_pre and /DQS_pre are respectively at the "H" level and the "L" level. In addition, when the duty ratio of the signals DQS_in and /DQS_in is smaller than 50%, the nodes DQS_pre and /DQS_pre are respectively at the "L" level and the "H" level.

The resistor R3 includes a first terminal, to which the voltage VDD is supplied, and a second terminal connected to a node /DQS_o. The transistor Tr9 includes a first terminal connected to the node /DQS_o, a second terminal connected to a node N4, and a gate connected to the node DQS_pre.

The resistor R4 includes a first terminal, to which the voltage VDD is supplied, and a second terminal connected to the node DQS_o. The transistor Tr10 includes a first terminal connected to the node DQS_o, a second terminal connected to the node N4, and a gate connected to the node /DQS_pre.

The transistor Tr11 includes a first terminal connected to the node N4, a second terminal, to which the voltage VSS is supplied, and a gate, to which a signal BIAS2 is supplied.

With the configuration as described above, it is possible to set the voltage levels of the nodes DQS_o and /DQS_pre according to the voltage levels applied to the nodes DQS_pre and /DQS_pre. That is, when the "H" level and "L" level are applied respectively to the nodes DQS_pre and /DQS_pre, the "H" level and "L" level are applied respectively to the nodes DQS_o and /DQS_o. In addition, when the "L" level and "H" level are applied respectively to the nodes DQS_pre and /DQS_pre, the "L" level and "H" level are applied respectively to the nodes DQS_o and /DQS_o.

The comparator COMP includes a first input terminal connected to the node DQS_o, a second input terminal connected to the node /DQS_o, and an output terminal, which outputs the signal FLG. The comparator COMP is driven by the voltage supplied from a signal TRIG. The comparator COMP switches the voltage level of the signal FLG to the "H" level or the "L" level according to a magnitude relationship of the voltage levels of the nodes DQS_o and /DQS_o. Specifically, the comparator COMP outputs the signal FLG of the "H" level when the nodes DQS_o and /DQS_o are respectively at the "H" level and the "L" level. In addition, the comparator COMP outputs the signal FLG of the "L" level when the nodes DQS_o and /DQS_o are respectively at the "L" level and the "H" level.

With the configuration as described above, the detection circuit 225 may output the signal FLG of the "H" level when the duty ratio of the signals DQS_in and /DQS_in is greater than 50%, and may out the signal FLG of the "L" level when the duty ratio of the signals DQS_in and /DQS_in is smaller than 50%.

1.2 About Operation

Next, an operation of the memory system according to the first embodiment will be described.

1.2.1 About Outline of Duty Ratio Calibration Operation

Figure 8:
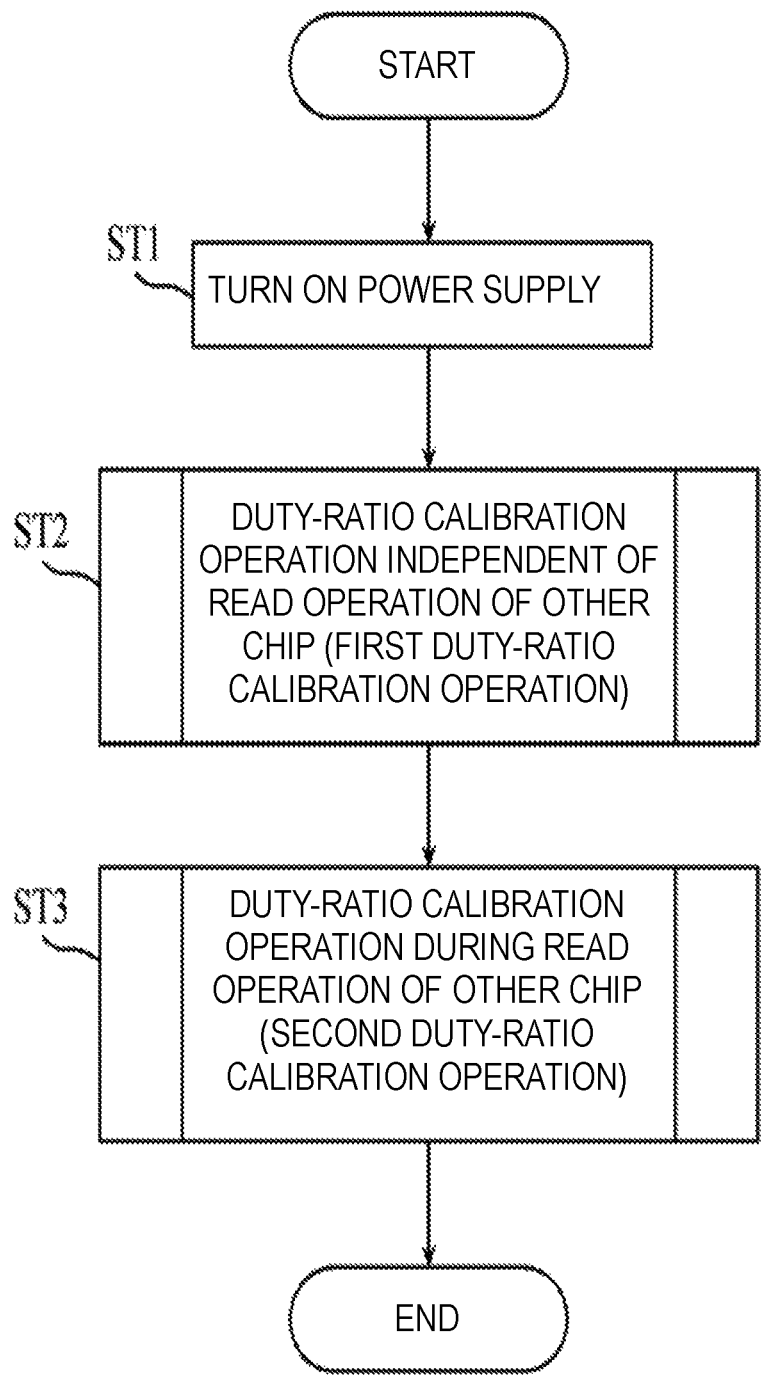
FIG. 8 is a flowchart depicting a duty ratio calibration operation in the memory system according to the first embodiment.

An outline of a duty ratio calibration operation in the memory system according to the first embodiment will be described with reference to a flowchart illustrated in FIG. 8. FIG. 8 illustrates two kinds of duty ratio calibration operations executed in each of the semiconductor storage devices 5 to 8 in the memory system 1. Further, in the following description, the semiconductor storage devices 5 to 8 will be described as chips A to D, respectively.

As illustrated in FIG. 8, the power supply of the memory system 1 is turned on in step ST1. The power manager 4 supplies the voltage VCCQ to the controller 2 and the NAND package 3, and also supplies the voltage VCC to the NAND package 3.

In step ST2, the controller 2 and the NAND package 3 execute a duty ratio calibration operation, which is independent of a read operation of data from another chip, as the power supply is turned on in step ST1. In the following description, the duty ratio calibration operation, independent of another chip read operation, is also referred to as a "first duty ratio calibration operation" for the sake of convenience.

In step ST3, the controller 2 and the NAND package 3 execute a duty ratio calibration operation in parallel with a read operation of data from another chip. In the following description, the duty ratio calibration operation during another chip read operation is also referred to as a "second duty ratio calibration operation" for the sake of convenience.

In this way, the duty ratio calibration operation ends.

Figure 9:
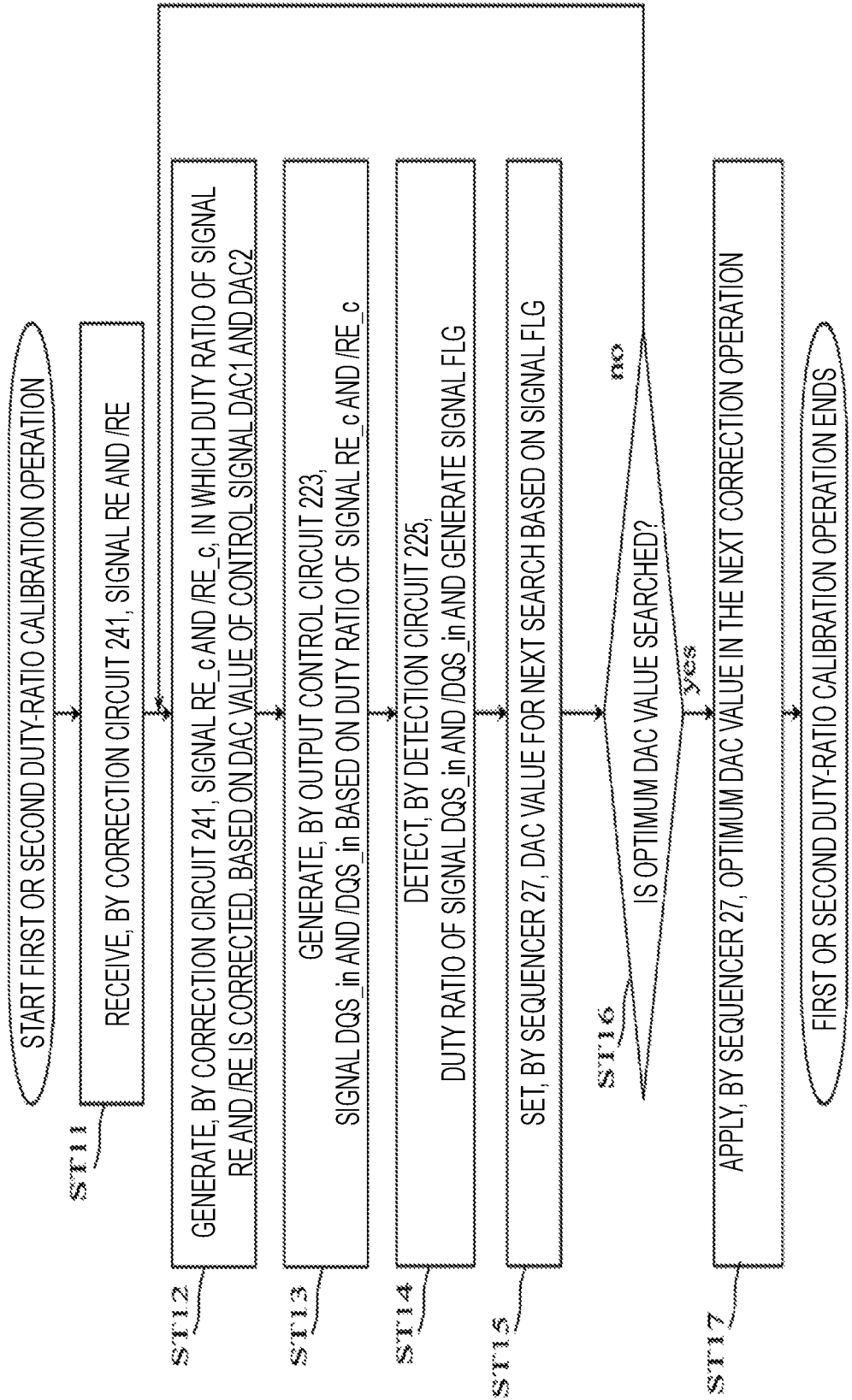
FIG. 9 is a flowchart depicting the duty ratio calibration operation in the memory system according to the first embodiment.

FIG. 9 is a flowchart depicting an operation in a chip in the duty ratio calibration operation in the memory system according to the first embodiment. The operation illustrated in FIG. 9 is common to the first duty ratio calibration operation and the second duty ratio calibration operation. That is, FIG. 9 illustrates an operation by the correction circuit 241, the output control circuit 223, the detection circuit 225, and the sequencer 27 until the duty ratio of the signals DQS_in and /DQS_in is calibrated based on the signals RE and /RE.

As illustrated in FIG. 9, in step ST11, the correction circuit 241 receives the signals RE and /RE from the controller 2. The duty ratio of the signals RE and /RE deviates from 50%, for example.

In step ST12, the correction circuit 241 generates the signals RE_c and /RE_c based on the control signals DAC1 and DAC2 from the sequencer 27. The signals RE_c and /RE_c are signals in which the duty ratio of the signals RE and /RE received in step ST11 is corrected according to the DAC value of the control signals DAC1 and DAC2. The signals RE_c and /RE_c are sent to the output control circuit 223. Details of a correction operation of generating the signals RE_c and /RE_c will be described later.

In step ST13, the output control circuit 223 generates the signals DQS_in and /DQS_in based on the duty ratio of the signals RE_c and /RE_c. The duty ratio of the signals RE_c and /RE_c and the duty ratio of the signals DQS_in and /DQS_in, for example, correlate with each other. Therefore, the detection circuit 225 may generate the signal FLG, which determines whether or not the duty ratio of the signals RE_c and /RE_c has been properly corrected, by monitoring the signals DQS_in and /DQS_in.

In step ST14, the detection circuit 225 detects the duty ratio of the signals DQS_in and /DQS_in, and generates the signal FLG. The signal FLG is inverted, for example, according to whether the duty ratio of the signals DQS_in and /DQS_in is equal to or greater than 50%, or less than 50%. Details of a detection operation of detecting the duty ratio of the signals DQS_in and /DQS_in will be described later.

In step ST15, the sequencer 27 sets the DAC value for next search in response to the signal FLG. Any method may be applied as a search method of the DAC value. Specifically, for example, binary search based on the signal FLG may be applied. More specifically, when the duty ratio is equal to or greater than 50%, the sequencer 27 sets the intermediate value of the search range, within which the duty ratio is reduced, as the DAC value for next search. In addition, when the duty ratio is less than 50%, the sequencer 27 sets the intermediate value of the search range, within which the duty ratio is increased, as the DAC value for next search. The search range of the DAC value is sequentially updated so as to be between previously set DAC values. Thereby, the sequencer 27 may determine an optimum DAC value by performing iteration search several times.

In step ST16, the sequencer 27 determines whether or not the optimum DAC value has been searched by current search. When it is determined that the optimum DAC value has been searched (step ST16; yes), the operation proceeds to step ST17. On the other hand, when it is determined that the optimum DAC value has not been searched (step ST16; no), the operation of steps ST12 to ST15 is repeated.

In step ST17, the sequencer 27 applies the DAC value, which is determined to be optimum, in the next correction operation of generating the signals RE_c and /RE_c.

By operating as described above, it is possible to generate the signals RE_c and /RE_c, the duty ratio of which is corrected, when the signals RE and /RE, the duty ratio of which deviates from 50%, are received. Then, the signals DQS_in and /DQS_in, the duty ratio of which is corrected, may be generated based on the signals RE_c and /RE_c.

1.2.2 About Duty Ratio Calibration Operation Independent of Another Chip Read Operation Next, the first duty ratio calibration operation in the memory system according to the first embodiment will be described.

Figure 10:
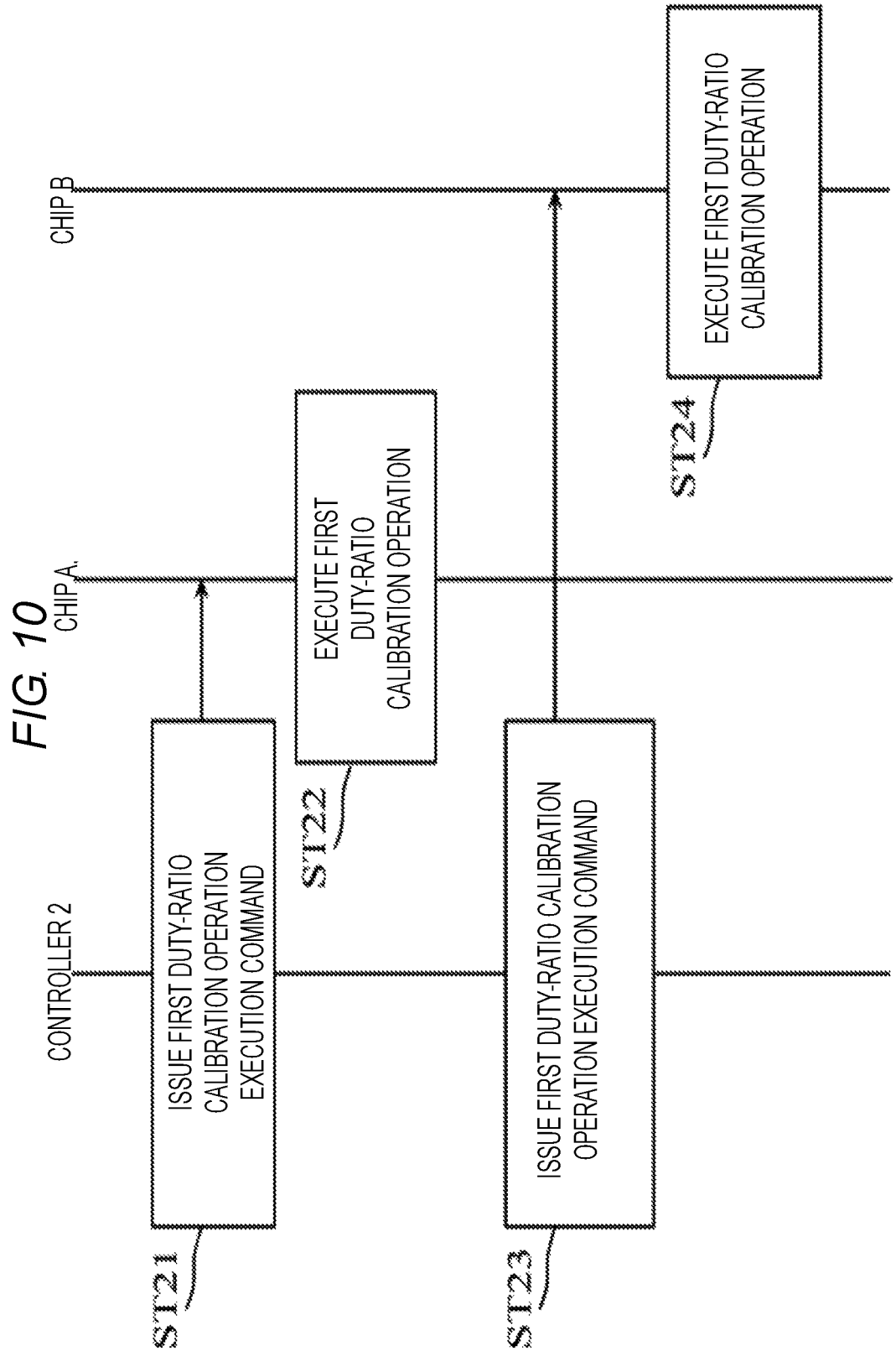
FIG. 10 is a flowchart depicting the duty ratio calibration operation, independent of another chip read operation, in the memory system according to the first embodiment.

FIG. 10 is a flowchart depicting the first duty ratio calibration operation in the memory system according to the first embodiment. FIG. 10 corresponds to a part of step ST2 described in FIG. 8, and illustrates a flowchart of the first duty ratio calibration operation for chips A and B among the chips A to D.

As illustrated in FIG. 10, in step ST21, the controller 2 issues a first duty ratio calibration operation execution command to the chip A. In step ST22, the chip A executes the first duty ratio calibration operation.

In step ST23, the controller 2 issues a first duty ratio calibration operation execution command to the chip B. In step ST24, the chip B executes the first duty ratio calibration operation.

Thereafter, by performing the same operation for the chips C and D, the first duty ratio calibration operation ends.

In this way, in the first duty ratio calibration operation, each of the chips A to D executes a duty ratio calibration operation for a time period, during which another chip is not executing a read operation.

Figure 11:
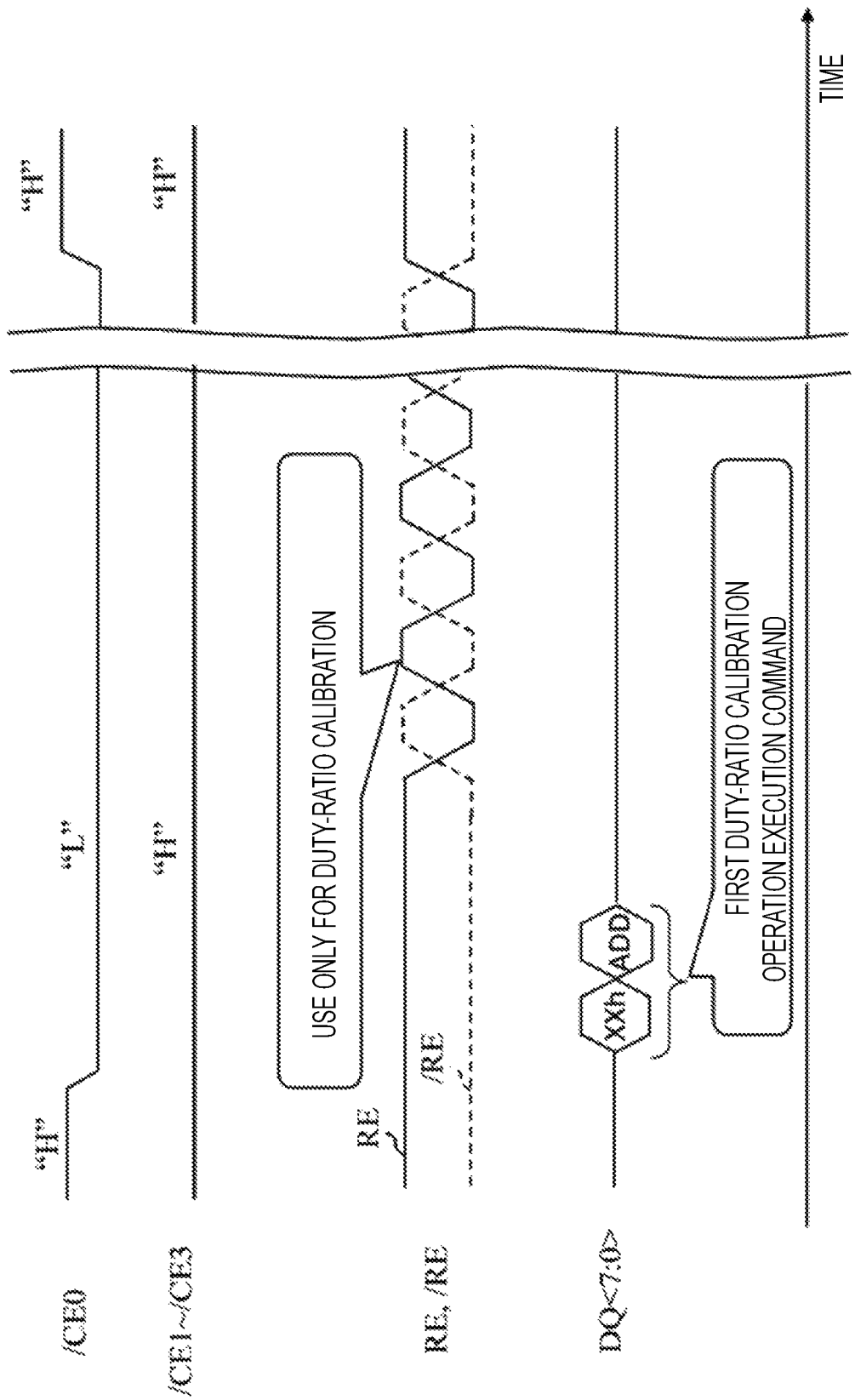
FIG. 11 is a command sequence for the duty ratio calibration operation, independent of another chip read operation, in the memory system according to the first embodiment.

FIG. 11 is a command sequence for the first duty ratio calibration operation in the memory system according to the first embodiment. In FIG. 11, the command sequence when the chip A executes the first duty ratio calibration operation is illustrated. That is, FIG. 11 corresponds to the steps ST21 and ST22 described in FIG. 10.

As illustrated in FIG. 11, the controller 2 sets the signal /CE0 to the "L" level to enable the chip A. The signals /CE1 to /CE3 are maintained at the "H" level.

The controller 2 issues a command "XXh". The command "XXh" is a command (first duty ratio calibration operation execution command) that instructs execution of a duty ratio calibration operation independent of another chip read operation. Subsequently, the controller 2 issues an address ADD, for example, over one cycle.

Subsequently, the controller 2 toggles the signals RE and /RE. When a set of the command "XXh" and the address ADD (hereinafter also referred to as the "first duty ratio calibration operation execution command") is stored in the register 26 of the chip A, the sequencer 27 of the chip A controls, for example, the input/output circuit 22 and the logic control circuit 24 based on the signals RE and /RE to start the first duty ratio calibration operation.

Further, in the first duty ratio calibration operation, the signals RE and /RE are used only for duty ratio calibration. Therefore, no data is read out from the other chips (the chips B to D in the example of FIG. 11) during the first duty ratio calibration operation.

The controller 2 issues a get feature command (not illustrated), for example, to determine whether or not the first duty ratio calibration operation in the chip A has ended. When the first duty ratio calibration operation in the chip A has ended, the controller 2 sets the signal /CE0 to the "H" level to disenable the chip A. Thereafter, by equally applying the above-described operation to the chips B to D, the first duty ratio calibration operation of the entire NAND package 3 ends.

1.2.3 About Duty Ratio Calibration Operation Executed During Another Chip Read Operation Next, the second duty ratio calibration operation in the memory system according to the first embodiment will be described.

Figure 12:
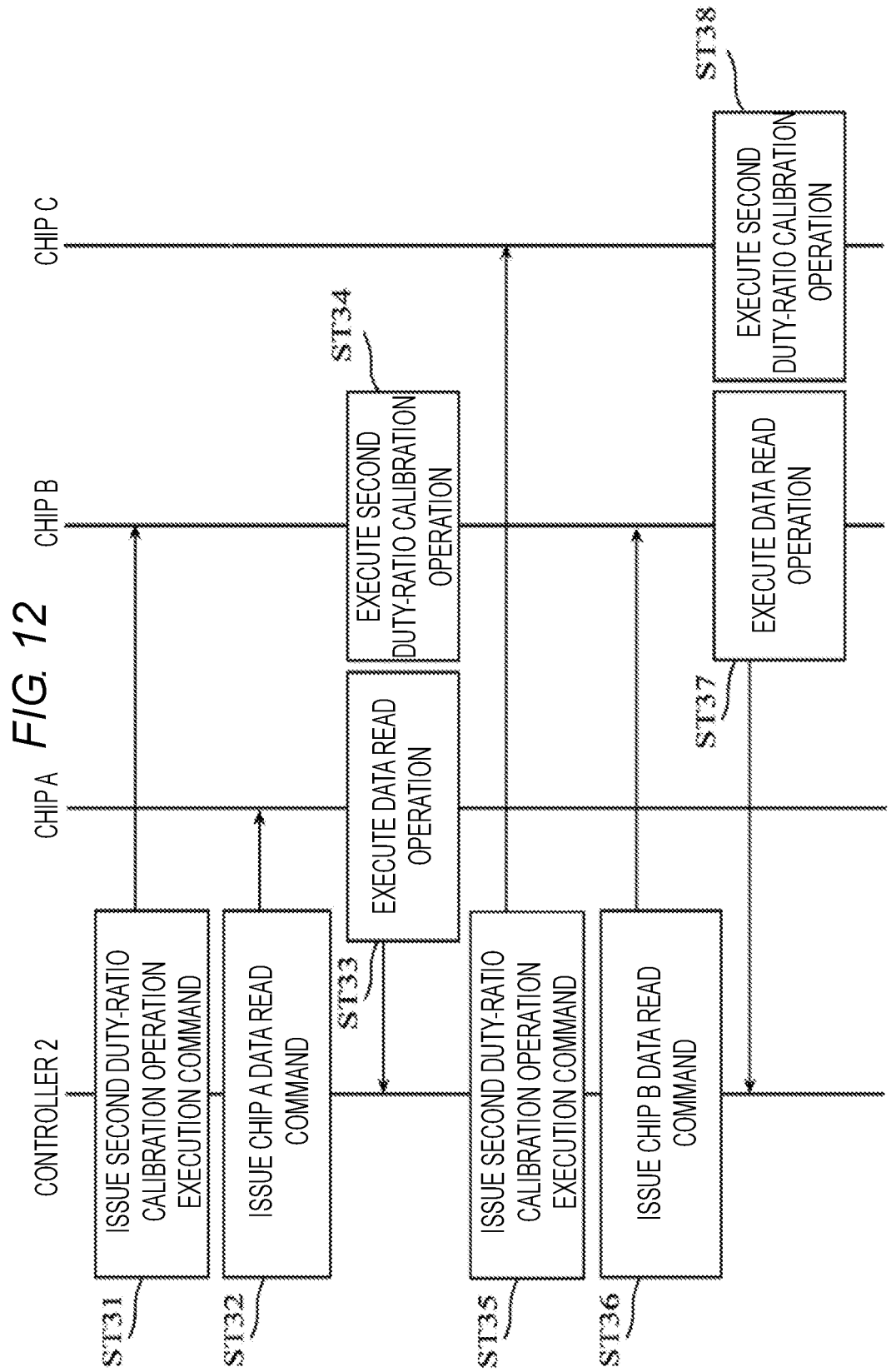
FIG. 12 is a flowchart depicting a duty ratio calibration operation executed during another chip read operation in the memory system according to the first embodiment.

FIG. 12 is a flowchart depicting the second duty ratio calibration operation in the memory system according to the first embodiment. FIG. 12 corresponds to a part of step ST3 described in FIG. 8, and illustrates a flowchart of the second duty ratio calibration operation for the chips B and C among the chips A to D.

As illustrated in FIG. 12, in step ST31, the controller 2 issues a second duty ratio calibration operation execution command to the chip B.

Subsequently, in step ST32, the controller 2 issues a command to read data to the chip A.

In step ST33, the chip A executes a data read operation in response to the data read command in step ST32. In step ST34, the chip B executes the second duty ratio calibration operation in response to the second duty ratio calibration operation execution command in step ST31, in parallel with step ST33.

Subsequently, in step ST35, the controller 2 issues a second duty ratio calibration operation execution command to the chip C.

In step ST36, the controller 2 issues a command to read data to the chip B. In step ST37, the chip B executes a data read operation in response to the data read command in step ST36. In step ST38, the chip C executes the second duty ratio calibration operation in response to the second duty ratio calibration operation execution command in step ST35, in parallel with step ST37.

Thereafter, by performing the same operation for the chips D and A, the second duty ratio calibration operation ends.

In this way, in the second duty ratio calibration operation, each of the chips A to D executes a duty ratio calibration operation for a time period, during which another chip is executing a read operation.

Figure 13:
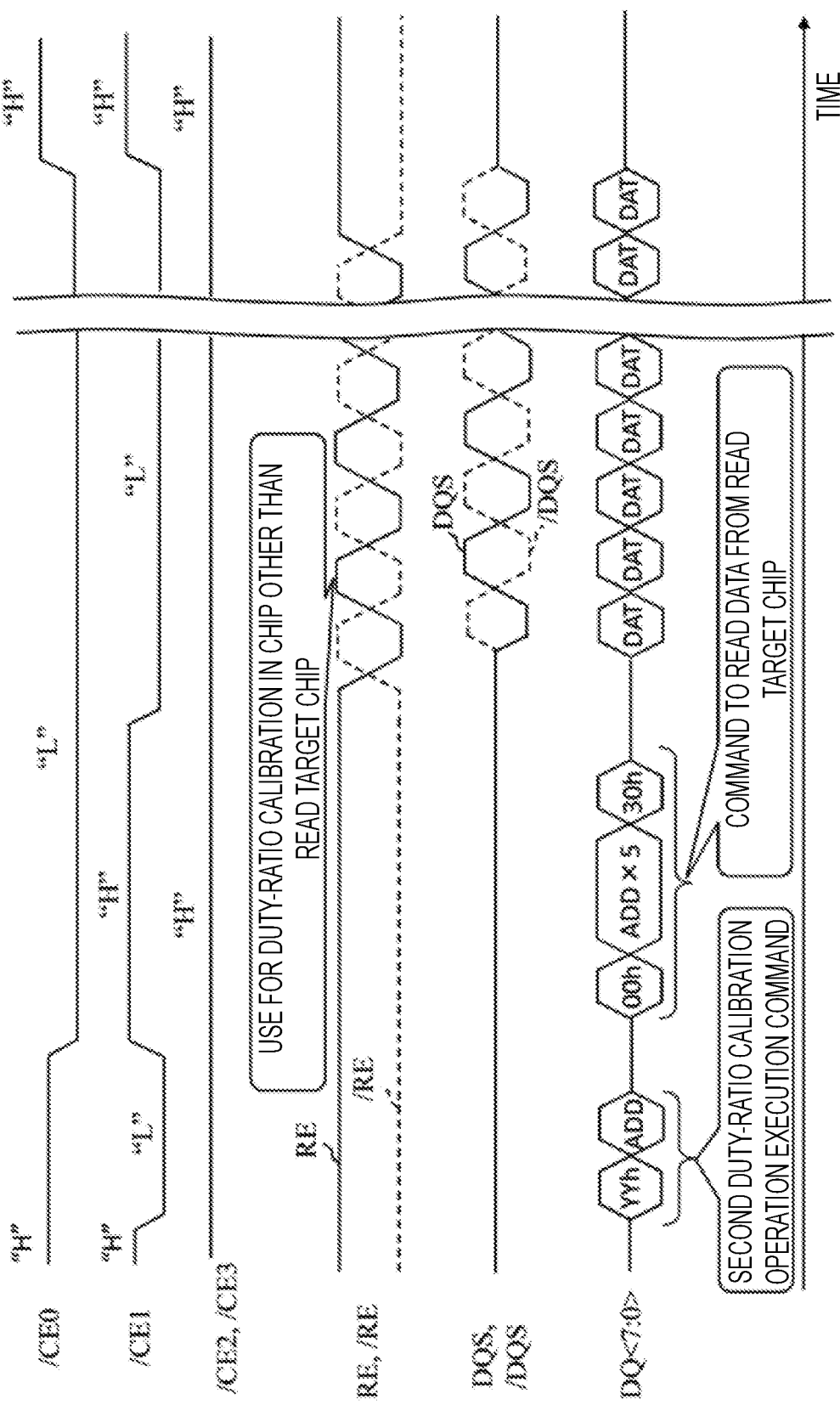
FIG. 13 is a command sequence for the duty ratio calibration operation executed during another chip read operation in the memory system according to the first embodiment.

FIG. 13 is a command sequence for the second duty ratio calibration operation in the memory system according to the first embodiment. In FIG. 13, the command sequence when the chip B executes the second duty ratio calibration operation is illustrated. That is, FIG. 13 corresponds to steps ST31 to ST34 described in FIG. 12.

As illustrated in FIG. 13, the controller 2 sets the signal /CE1 to the "L" level to enable the chip B. The signals /CE0, /CE2, and /CE3 are maintained at the "H" level.

The controller 2 issues a command "YYh", and transmits the same to the chip B. The command "YYh" is a command (second duty ratio calibration operation execution command) that instructs execution of a duty ratio calibration operation during another chip read operation. Subsequently, the controller 2 issues an address ADD, for example, over one cycle, and transmits the same to the chip B.

Subsequently, the controller 2 sets the signal /CE1 to the "H" level to disenable the chip B, and sets the signal /CE0 to the "L" level to enable the chip A.

The controller 2 issues a first read command "00h", and subsequently, issues an address ADD, for example, over five cycles. Thereafter, the controller 2 issues a second read command "30h".

When the command "30h" is stored in the register 26 of the chip A, the sequencer 27 of the chip A controls, for example, the voltage generation circuit 28, the driver set 29, the row decoder 30, and the sense amplifier 31 to start a read operation.

Subsequently, the controller 2 sets the signal /CE1 to the "L" level again to enable the chip B, and thereafter asserts the signals RE and /RE repeatedly and alternately. Whenever the signals RE and /RE are toggled, the data read out from the memory cell array 21 of the chip A is transmitted to the controller 2.

In addition, in parallel with the read operation of data from the chip A, the sequencer 27 of the chip B controls, for example, the input/output circuit 22 and the logic control circuit 24 based on the signals RE and /RE to start the second duty ratio calibration operation.

When the read operation in the chip A and the second duty ratio calibration operation in the chip B end, the controller 2 sets the signals /CE0 and /CE1 to the "H" level to disenable the chip A and the chip B. Thereafter, by equally applying the above-described operation to the other chips, the second duty ratio calibration operation of the entire NAND package 3 ends.

1.2.4 About Correction Operation

Figure 14:
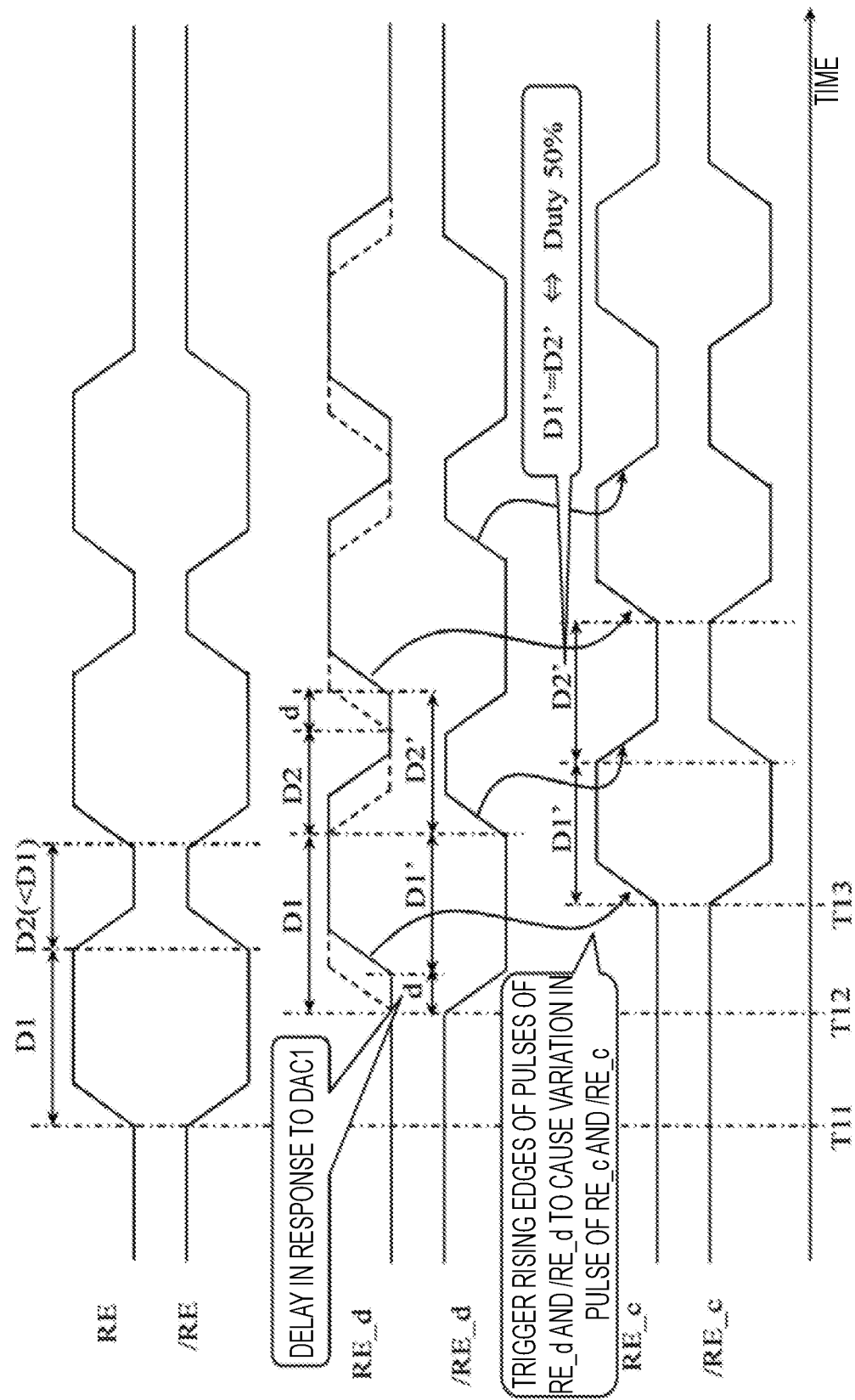
FIG. 14 is a timing chart for explaining a correction operation in the memory system according to the first embodiment.
Figure 15:
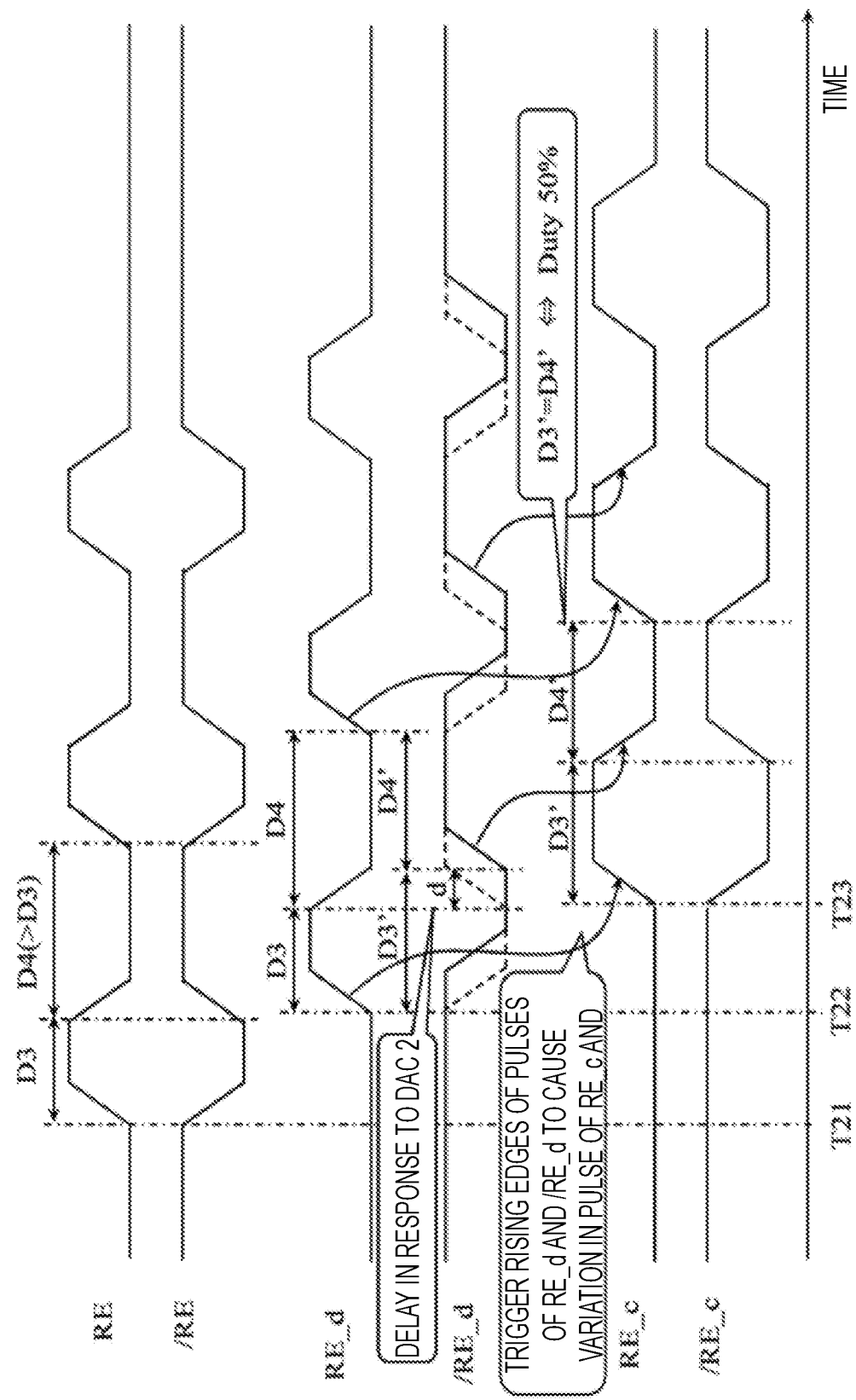
FIG. 15 is a timing chart for explaining a correction operation in the memory system according to the first embodiment.

Next, a correction operation in the memory system according to the first embodiment will be described with reference to FIGS. 14 and 15. FIGS. 14 and 15 are timing charts for explaining a duty ratio correction operation in the correction circuit according to the first embodiment. FIGS. 14 and 15 correspond to step ST12 described in FIG. 9. FIG. 14 illustrates a correction operation when the duty ratio of the signals RE and /RE is greater than 50%, and FIG. 15 illustrates a correction operation when the duty ratio of the signals RE and /RE is less than 50%.

First, a correction operation when the duty ratio of the signals RE and /RE is greater than 50% will be described with reference to FIG. 14.

As illustrated in FIG. 14, at time T11, the signals RE and /RE start to toggle. As described above, the duty ratio of the signals RE and /RE deviates to a state where it is greater than 50%. In the example of FIG. 14, the time from the rising edge to the falling edge of a pulse of the signal RE (which is equal to the time from the falling edge to the rising edge of a pulse of the signal /RE) is indicated by D1. In addition, the time from the falling edge to the rising edge of the pulse of the signal RE (which is equal to the time from the rising edge to the falling edge of the pulse of the signal /RE) is indicated by D2 (<D1).

At time T12, the falling edge of the pulse of the signal /RE at time T11 is transmitted to the node /RE_d. On the other hand, the rising edge of the pulse of the signal RE at time T11 is not transmitted to the node RE_d at time T12. This is because, when the duty ratio of the signals RE and /RE is greater than 50%, the sequencer 27 adjusts the control signal DAC1 to change the capacitances of the variable capacitors C1 and C2 in the correction circuit 241 and increase the amount of delay of the signal RE_d.

More specifically, the sequencer 27 adds delay d to the node RE_d based on the control signal DAC1. Thereby, at time T12+d, the rising edge of the pulse of the signal RE at time T11 is transmitted to the node RE_d. That is, the nodes RE_d and /RE_d toggle while maintaining the duty ratio (D1/(D1+D2)) of the signals RE and /RE in a state of deviating from each other by the amount of delay d as described above.

At time T13, the rising edge of the pulse of the signal RE at time T12+d is transmitted to the node RE_c. The pulse of the node /RE_c rises according to the rising edge of the pulse of the node RE_c. Thereafter, the pulses of the nodes RE_c and /RE_c vary according to the rising edge of the pulses of the nodes RE_d and /RE_d. In the example of FIG. 14, the time from the rising edge to the falling edge of the pulse of the node RE_d (which is equal to the time from the falling edge to the rising edge of the pulse of the node /RE_d) is indicated by D1'. In addition, the time from the falling edge to the rising edge of the pulse of the node RE_d (which is equal to the time from the rising edge to the falling edge of the pulse of the node /RE_d) is indicated by D2'.

Since the nodes RE_d and /RE_d deviate from each other by the amount of delay d as described above, the time D1' from the rising edge of the pulse of the node RE_d to the rising edge of the pulse of the node /RE_d is (D1-$d$). In addition, the time D2' from the rising edge of the pulse of the node /RE_d to the rising edge of the pulse of the node RE_d is (D2+d).

Therefore, the sequencer 27 may adjust the control signal DAC1 so that the amount of delay d satisfies D1'=D2' (i.e., d=(D1−D2)/2), thereby correcting the duty ratio of the nodes RE_c and /RE_c to 50%.

Next, a correction operation when the duty ratio of the signals RE and /RE is smaller than 50% will be described with reference to FIG. 15.

As illustrated in FIG. 15, at time T21, the signals RE and /RE start to toggle. As described above, the duty ratio of the signals RE and /RE deviates to a state where it is smaller than 50%. In the example of FIG. 15, the time from the rising edge to the falling edge of the pulse of the signal RE (which is equal to the time from the falling edge to the rising edge of the pulse of the signal /RE) is indicated by D3. In addition, the time from the falling edge to the rising edge of the pulse of the signal RE (which is equal to the time from the rising edge to the falling edge of the pulse of the signal /RE) is indicated by D4 (>D3).

At time T22, the rising edge of the pulse of the signal RE at time T21 is transmitted to the node RE_d. On the other hand, the falling edge of the pulse of the signal /RE at time T21 is not transmitted to the node /RE_d at time T22. This is because, when the duty ratio of the signals RE and /RE is smaller than 50%, the sequencer 27 adjusts the control signal DAC2 to change the capacitances of the variable capacitors C3 and C4 in the correction circuit 241 and increase the amount of delay of the signal /RE_d.

More specifically, the sequencer 27 adds delay d to the node /RE_d based on the control signal DAC2. Thereby, the falling edge of the pulse of the signal /RE at time T21 is transmitted to the node /RE_d at time T22+d. That is, the nodes RE_d and /RE_d toggle while maintaining the duty ratio (D3/(D3+D4)) of the signals RE and /RE in a state of deviating from each other by the amount of delay d as described above.

At time T23, the rising edge of the pulse of the signal RE at time T22 is transmitted to the node RE_c. The pulse of the node /RE_c rises according to the rising edge of the pulse of the node RE_c. Thereafter, the pulses of the nodes RE_c and /RE_c vary according to the rising edge of the pulses of the nodes RE_d and /RE_d. In the example of FIG. 15, the time from the rising edge to the falling edge of the pulse of the node RE_d (which is equal to the time from the falling edge to the rising edge of the pulse of the node /RE_d) is indicated by D3'. In addition, the time from the falling edge to the rising edge of the pulse at the node RE_d (which is equal to the time from the rising edge to the falling edge of the pulse of the node /RE_d) is indicated by D4'.

Since the nodes RE_d and /RE_d deviate from each other by the amount of delay d as described above, the time D3' from the rising edge of the pulse of the node RE_d to the rising edge of the pulse of the node /RE_d is (D3+d). In addition, the time D4' from the rising edge of the pulse of the node /RE_d to the rising edge of the pulse of the node RE_d is (D4-$d$).

Therefore, the sequencer 27 may adjust the control signal DAC2 so that the amount of delay d satisfies D3'=D4' (i.e., d=(D4−D3)/2), thereby correcting the duty ratio of the nodes RE_c and /RE_c to 50%.

In this way, the correction operation by the correction circuit 241 ends.

1.2.5 About Detection Operation

Figure 16:
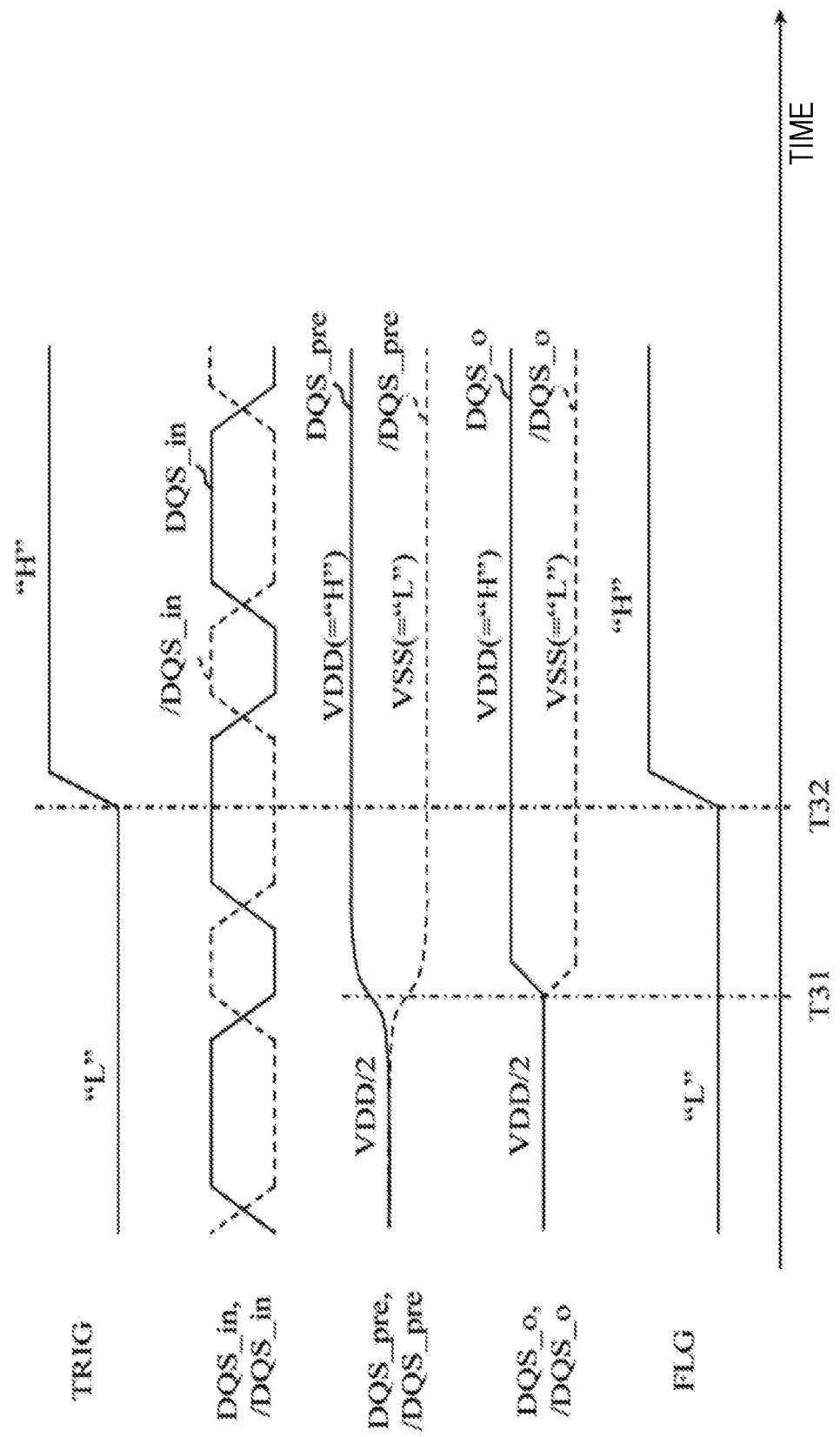
FIG. 16 is a timing chart for explaining a detection operation in the memory system according to the first embodiment.
Figure 17:
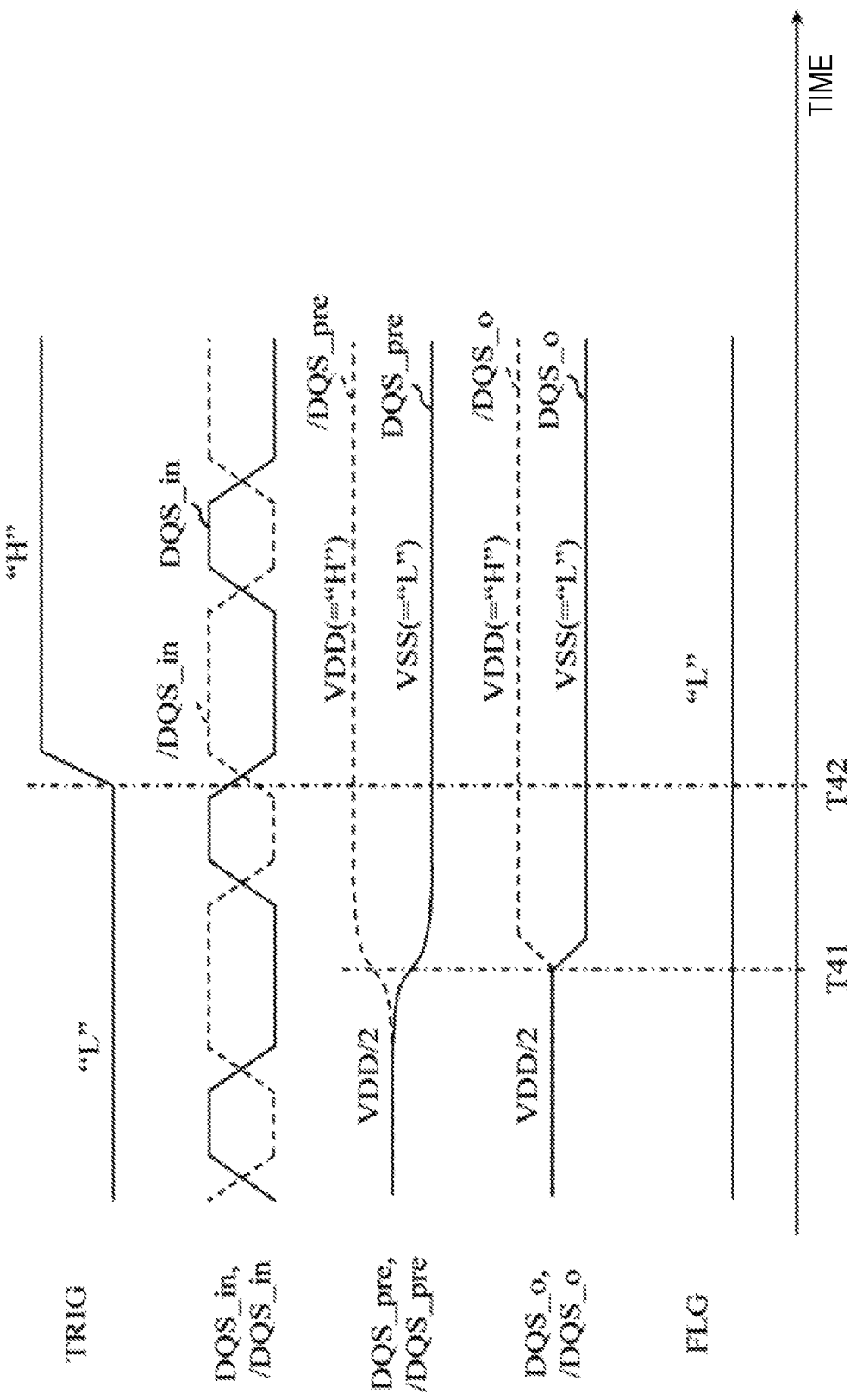
FIG. 17 is a timing chart for explaining a detection operation in the memory system according to the first embodiment.

Next, a duty ratio detection operation in the memory system according to the first embodiment will be described with reference to FIGS. 16 and 17. FIGS. 16 and 17 are timing charts for explaining an operation of detecting the duty ratio in the detection circuit according to the first embodiment. FIGS. 16 and 17 correspond to step ST14 described in FIG. 9. FIG. 16 illustrates a detection operation when the duty ratio of the signals DQS_in and /DQS_in is greater than 50%, and FIG. 17 illustrates a detection operation when the duty ratio of the signals DQS_in and /DQS_in is smaller than 50%.

First, a detection operation in a case where the duty ratio of the signals DQS_in and /DQS_in is greater than 50% will be described with reference to FIG. 16.

As illustrated in FIG. 16, before time T31, the nodes DQS_pre and /DQS_pre have voltages of about VDD/2, for example. That is, the voltage levels of the nodes DQS_pre and /DQS_pre are not determined. Along with this, the voltage levels of the nodes DQS_o and /DQS_o are also not determined. In addition, since the signal TRIG is set to the "L" level, the comparator COMP is not driven.

When the toggled signals DQS_in and /DQS_in are input in a state where the duty ratio thereof is greater than 50%, the capacitor C5 is charged with the signal DQS_pre having a long rise time, and the capacitor C6 is discharged by the signal /DQS_pre having a short rise time. Thereby, the voltage of the signal DQS_pre gradually rises from the voltage VDD/2, and the voltage of the signal /DQS_pre gradually drops from the voltage VDD/2.

At time T31, a voltage difference between the signals DQS_pre and /DQS_pre significantly increases. That is, the voltage levels of the signals DQS_pre and /DQS_pre become the "H" level and the "L" level, respectively. Thereby, the transistors Tr9 and Tr10 are turned on and off, respectively, and the "H" level and "L" level are applied respectively to the nodes DQS_o and /DQS_o.

At time T32, the "H" level is applied to the signal TRIG, and the comparator COMP is driven. Along with this, the comparator COMP compares the voltage levels of the nodes DQS_o and /DQS_o with each other, and outputs the comparison result to the signal FLG. In the example of FIG. 16, since the nodes DQS_o and /DQS_o are at the "H" level and the "L" level, respectively, the comparator COMP outputs the signal FLG of the "H" level.

By operating as described above, the sequencer 27 may determine that the duty ratio of the signals DQS_in and /DQS_in is greater than 50% by receiving the signal FLG of the "H" level.

Next, a detection operation when the duty ratio of the signals DQS_in and /DQS_in is smaller than 50% will be described with reference to FIG. 17.

As illustrated in FIG. 17, a state before time T41 is the same as the state before time T31 in FIG. 14.

When the toggled signals DQS_in and /DQS_in are input in a state where the duty ratio is smaller than 50%, the capacitor C5 is discharged by the signal DQS_pre having a short rise time, and the capacitor C6 is charged with the signal /DQS_pre having a long rise time. Thereby, the voltage of the signal DQS_pre gradually drops from the voltage VDD/2, and the voltage of the signal /DQS_pre gradually rises from the voltage VDD/2.

At time T41, a voltage difference between the signals DQS_pre and /DQS_pre significantly increases. That is, the voltage levels of the signals DQS_pre and /DQS_pre become the "L" level and the "H" level, respectively. Thereby, the transistors Tr9 and Tr10 are turned off and on, respectively, and the "L" level and "H" level are applied respectively to the nodes DQS_o and /DQS_o.

At time T42, the "H" level is applied to the signal TRIG, and the comparator COMP is driven. Along with this, the comparator COMP compares the voltage levels of the nodes DQS_o and /DQS_o with each other, and outputs the comparison result to the signal FLG. In the example of FIG. 17, since the nodes DQS_o and /DQS_o are at the "L" level and the "H" level, respectively, the comparator COMP outputs the signal FLG of the "L" level.

By operating as described above, the sequencer 27 may determine that the duty ratio of the signals DQS_in and /DQS_in is smaller than 50% by receiving the signal FLG of the "L" level.

In this way, the detection operation of the duty ratio by the detection circuit 225 ends.

1.3 Effect of Present Embodiment

According to the first embodiment, an output signal may be calibrated according to variation in duty ratio after the power supply is turned on. This effect will be described below.

The controller 2 transmits, for example, the signals RE and /RE to the chips A to D in common, and transmits and receives, for example, the signals DQ<7:0>, DQS, and /DQS to and from the chips A to D in common. The chip A reads data held in the chip A whenever the signals RE and /RE toggle upon receiving a read command and the signals RE and /RE from the controller 2. The chip B uses the signals RE and /RE, which are used to read data from the chip A, and calibrates the duty ratio of the signals DQS and /DQS generated in the chip A in response to the signals RE and /RE upon further receiving the command "YYh" from the controller 2. Thereby, an operation of calibrating the duty ratio of the signals DQS and /DQS may be executed in parallel with an operation of reading data by another chip. Therefore, it is possible to allocate the time required for executing the operation of calibrating the duty ratio of the signals DQS and /DQS alone to another operation. Therefore, it is possible to prevent deterioration in the operation performance of the memory system 1.

As an alternative, immediately after the power supply is turned on, the controller 2 issues a command "XXh" to cause each of the chips A to D to execute duty ratio calibration, independently of a data read operation. However, there is a possibility that the duty ratio varies from an appropriate state after duty ratio calibration, for example, due to variation in temperature or voltage in the memory system 1. When the duty ratio calibration is executed independently of the data read operation, there is a possibility that the performance of the memory system 1 may be deteriorated since, while one chip operates, the other chips cannot operate. Further, it is also possible to perform calibration within a shorter time by using a circuit such as, for example, a phase lock loop (PLL) circuit or a delay lock loop (DLL) circuit (none of them is illustrated). However, since these circuits occupy a large area, there is a possibility that they have an adverse effect on the design of the memory system 1.

According to the first embodiment, as described above, since the duty ratio is calibrated in parallel with a read operation of data from another chip, it is unnecessary to secure the time required for the duty ratio calibration operation alone. Thereby, it is possible to execute the duty ratio calibration operation at any timing at which data is read from another chip. Therefore, even when the duty ratio varies due to variation in temperature or voltage due to some factors after the power supply is turned on, the duty ratio may be calibrated without deteriorating the operation performance of the memory system 1 and without using, for example, the PLL circuit. Therefore, an output signal may be calibrated according to variation in duty ratio after the power supply is turned on.

2. Second Embodiment

Next, a memory system according to a second embodiment will be described. The memory system according to the second embodiment is different from the memory system according to the first embodiment in terms of a difference in the time required for an operation between a case where the duty ratio calibration operation is executed independently of another chip read operation and a case where the duty ratio calibration operation is executed during another chip read operation. That is, the memory system according to the second embodiment executes the duty ratio calibration operation during another chip read operation within a shorter time than that in a case of executing the duty ratio calibration operation, independently of another chip read operation.

In addition, the memory system according to the second embodiment has the same configuration as that of the memory system according to the first embodiment. Hereinafter, the same components as those of the first embodiment will be denoted by the same reference numerals and a description thereof will be omitted, and only the portions different from the first embodiment will be described.

2.1 About Outline of Duty Ratio Calibration Operation

Figure 18:
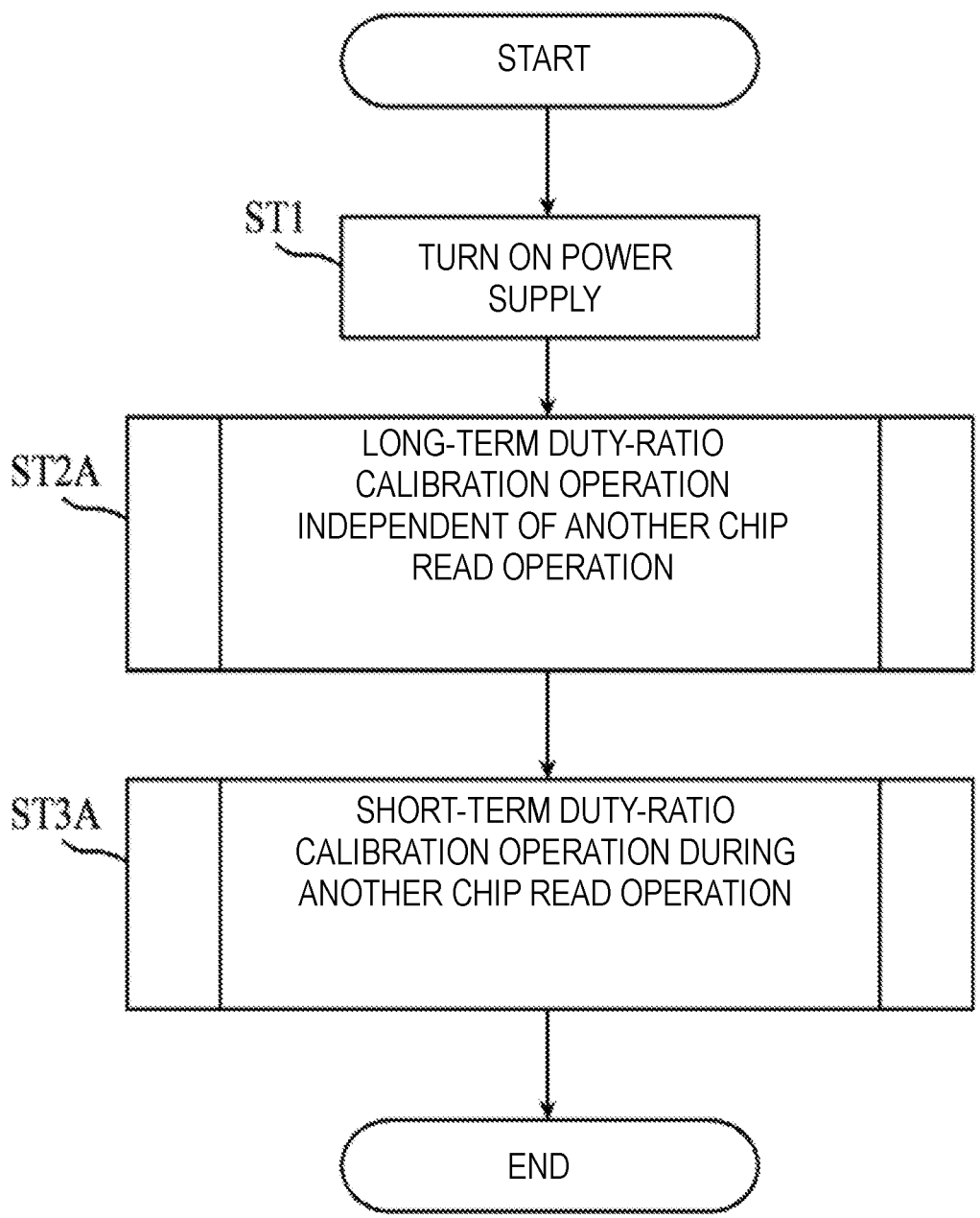
FIG. 18 is a flowchart depicting a duty ratio calibration operation in a memory system according to a second embodiment.

An outline of a duty ratio calibration operation in the memory system according to the second embodiment will be described with reference to a flowchart illustrated in FIG. 18. FIG. 18 corresponds to FIG. 8 described in the first embodiment.

As illustrated in FIG. 18, the power supply of the memory system 1 is turned on in step ST1. The power manager 4 supplies the voltage VCCQ to the controller 2 and the NAND package 3, and further supplies the voltage VCC to the NAND package 3.

In step ST2A, the controller 2 and the NAND package 3 execute a duty ratio calibration operation (first duty ratio calibration operation) independent of a read operation of data from another chip as the power supply is turned on in step ST1. Further, the first duty ratio calibration operation according to the second embodiment requires a longer operation time than that of the second duty ratio calibration operation illustrated in the following step ST3A. Thus, the first duty ratio calibration operation according to the second embodiment is also referred to as a "long-term duty ratio calibration operation".

In step ST3A, the controller 2 and the NAND package 3 execute the duty ratio calibration operation (second duty ratio calibration operation) in parallel with a read operation of data from another chip. Further, the second duty ratio calibration operation according to the second embodiment, as described above, requires a shorter operation time than that of the first duty ratio calibration operation illustrated in step ST2A. Thus, the second duty ratio calibration operation according to the second embodiment is also referred to as a "short-term duty ratio calibration operation".

In this way, the duty ratio calibration operation ends.

2.2 About Search Range of Control Signal

Figure 19:
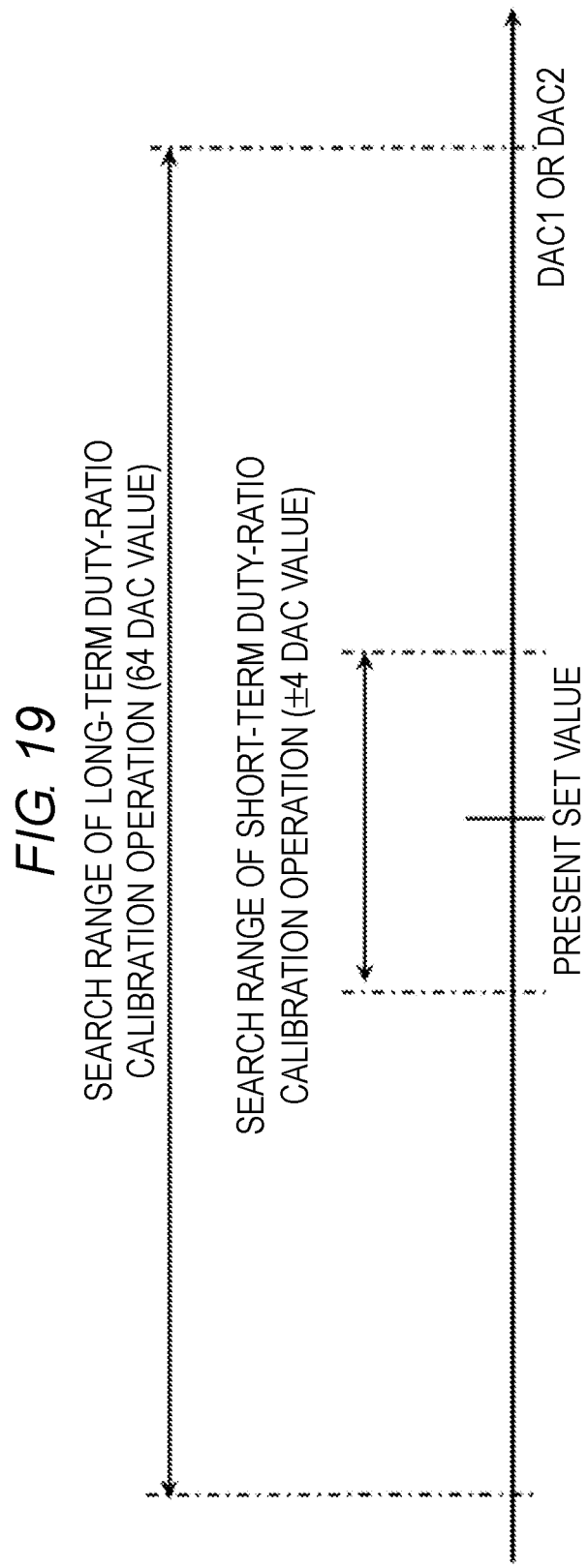
FIG. 19 is a schematic diagram for explaining the search range of a control signal in the memory system according to the second embodiment.

Next, the search range of a control signal generated by the duty ratio calibration operation in the memory system according to the second embodiment will be described with reference to a schematic diagram illustrated in FIG. 19. In FIG. 19, the search ranges of the control signals DAC1 and DAC2 in the long-term duty ratio calibration operation and the short-term duty ratio calibration operation are schematically illustrated.

As illustrated in FIG. 19, for example, 6 bits are allocated to the range of values that the control signals DAC1 and DAC2 may take. In this case, the control signals DAC1 and DAC2 may take the range of up to 64 digital-to-analog convertor (DAC) values.

At the time of the long-term duty ratio calibration operation, the sequencer 27 searches the range of all values allocated to the control signal DAC1 or DAC2. Thereby, the correction circuit 241 may select an optimum combined capacity from the range of all combined capacitances that the variable capacitors C1 and C2, or C3 and C4 may take, and may generate an optimum amount of delay d corresponding to the optimum combined capacity. Therefore, the correction circuit 241 may correct the duty ratio of the nodes RE_c and /RE_c to a desired value.

On the other hand, at the time of the short-term duty ratio calibration operation, the sequencer 27 searches DAC values before and after a present set value (in the example of FIG. 19, ±4 DAC values), among the range of values allocated to the control signal DAC1 or DAC2. Thereby, the correction circuit 241 may correct the duty ratio of the nodes RE_c and /RE_c to a desired value by searching the range smaller than that in the long-term duty ratio calibration operation.

2.3 Effect of Present Embodiment

According to the memory system of the second embodiment, a duty ratio calibration operation, which is executed independently of a read operation from another chip, and a duty ratio calibration operation, which is executed during a read operation from another chip, have a difference in the time required for the operation. Thereby, it is possible to reduce the time required for the duty ratio calibration operation executed during the read operation from another chip. As an alternative, when the duty ratio varies due to variation in temperature or voltage, there is a high possibility that an optimum set value of the control signal DAC1 or DAC2 exists in a range that does not deviate significantly from a present set value. In the second embodiment, in the duty ratio calibration operation executed during the read operation from another chip, several DAC values around a present set value are searched from the searchable range of the control signal DAC1 or DAC2. Thereby, the time required for the search may be reduced as compared with a case of searching the range of all values. In addition, by intensively searching the values around the present set value, it is possible to efficiently search the range within which the optimum set value is likely to exist.

Further, the short-term duty ratio calibration operation is not limited to the above-described example, and any search method may be set. For example, a duty ratio calibration operation, which is executed independently of a read operation from another chip, and a duty ratio calibration operation, which is executed during a read operation from another chip, may have a difference in the accuracy of calibration. Specifically, the short-term duty ratio calibration operation may search the range of all values allocated to the control signal DAC1 or DAC2 at a rougher search interval (e.g., the interval of several DAC values) than that in the long-term duty ratio calibration operation. Thereby, even in a case where the optimum set value of the control signal DAC1 or DAC2 exists in a range that deviates significantly from the present set value, it is possible to grasp an approximate position of the optimum set value within a short time.

3. Third Embodiment

Next, a memory system according to a third embodiment will be described. The memory system according to the third embodiment is different from the memory system according to the first embodiment in that execution of a duty ratio calibration operation is instructed by a set feature command without using a dedicated command.

Further, the memory system according to the third embodiment has the same configuration as that of the memory system according to the first embodiment. Hereinafter, the same components as those of the first embodiment will be denoted by the same reference numerals and a description thereof will be omitted, and only the portions different from the first embodiment will be described.

3.1 About Command Sequence

Figure 20:
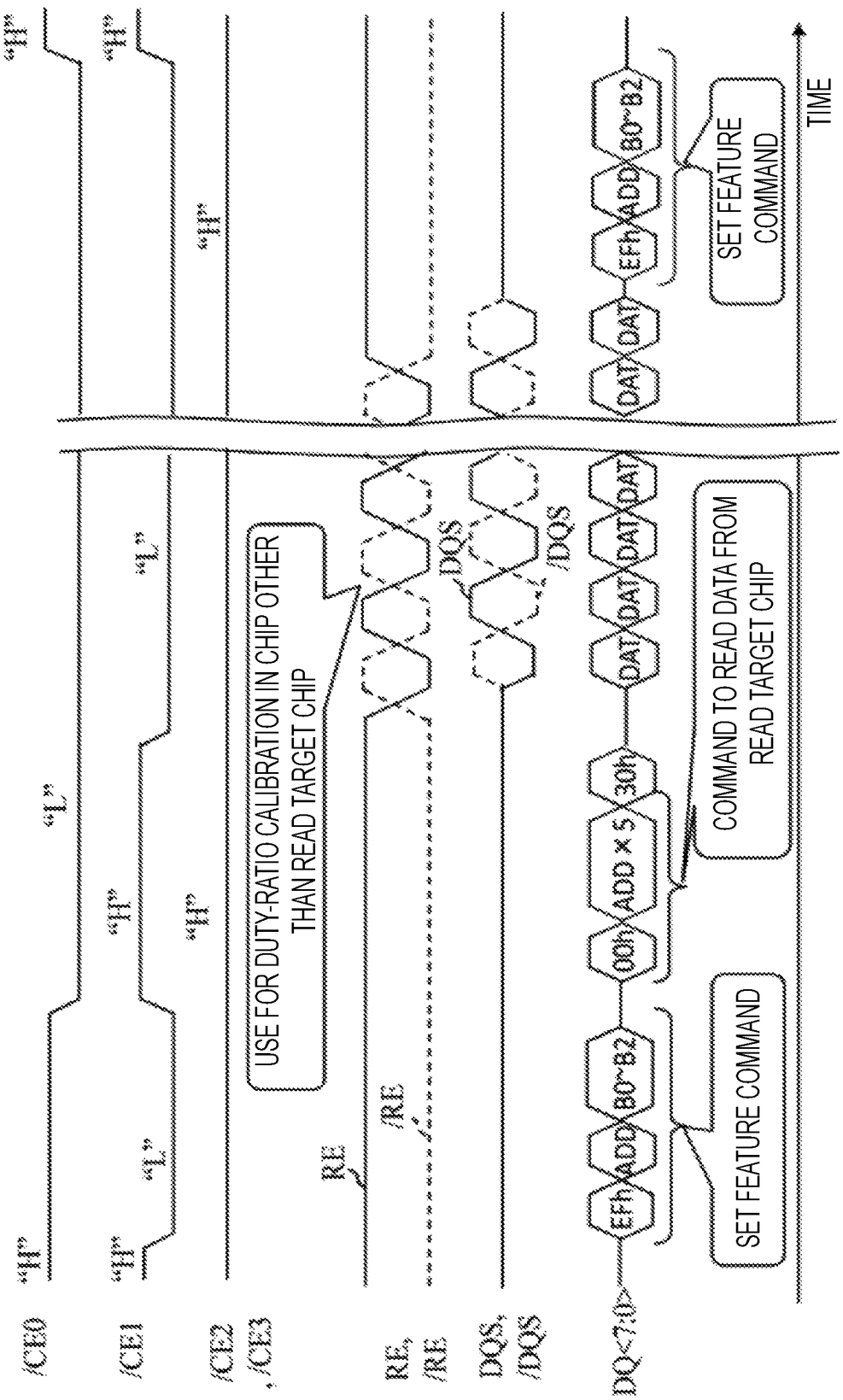
FIG. 20 is a command sequence for a duty ratio calibration operation executed during another chip read operation in a memory system according to a third embodiment.

FIG. 20 is a command sequence for the second duty ratio calibration operation in the memory system according to the third embodiment. FIG. 20 corresponds to FIG. 13 of the first embodiment.

As illustrated in FIG. 20, the controller 2 sets the signal /CE1 to the "L" level to enable the chip B. The signals /CE0, /CE2, and /CE3 are maintained at the "H" level.

The controller 2 issues a command "EFh", and transmits the same to the chip B. The command "EFh" is a set feature command that instructs to change setting of various operations. Subsequently, the controller 2 issues an address ADD, for example, over one cycle, and transmits the same to the chip B. The address ADD designates, for example, the address in the register 26 in which setting related to a duty ratio calibration operation is stored, among settings of the above-described various operations. Subsequently, the controller 2 issues data B0 to B2 over several cycles (e.g., three cycles), and transmits the same to the chip B. The data B0 to B2 include information that designates the type of a duty ratio calibration operation to be executed (e.g., which one of the first duty ratio calibration operation or the second duty ratio calibration operation is executed). In the example of FIG. 20, the controller 2 instructs the chip B to execute the second duty ratio calibration operation during a following read operation from another chip by the command "EFh", the address ADD, and the data B0 to B2.

Subsequently, the controller 2 sets the signal /CE1 to the "H" level to disenable the chip B, and also sets the signal /CE0 to the "L" level to enable the chip A.

The controller 2 issues a first read command "00h", and subsequently issues an address ADD, for example, over five cycles. The address ADD includes the chip address of the chip A. Thereafter, the controller 2 issues a second read command "30h".

When the command "30h" is stored in the register 26 of the chip A, the sequencer 27 of the chip A controls, for example, the voltage generation circuit 28, the driver set 29, the row decoder 30, and the sense amplifier 31 to start a read operation.

Subsequently, the controller 2 sets the signal /CE1 to the "L" level again to enable the chip B.

The controller 2 asserts the signals RE and /RE repeatedly and alternately. Whenever the signals RE and /RE are toggled, data read from the memory cell array 21 of the chip A is transmitted to the controller 2.

In parallel with the read operation of data from the chip A, the sequencer 27 of the chip B controls, for example, the input/output circuit 22 and the logic control circuit 24 based on the signals RE and /RE to start the second duty ratio calibration operation.

When the read operation in the chip A and the second duty ratio calibration operation in the chip B end, the controller 2 issues the command "EFh", the address ADD, and the data B0 to B2, and transmits the same to the chip B. By appropriately setting information included in the data B0 to B2, the controller 2 instructs the chip B not to execute the second duty ratio calibration operation in the following read operation from another chip.

Subsequently, the controller 2 sets the signals /CE0 and /CE1 to the "H" level to disenable the chip A and the chip B. Thereafter, by equally applying the above-described operation after the issue of the read command to the other chips, the second duty ratio calibration operation of the entire NAND package 3 ends.

FIG. 21 is a table for explaining setting related to the duty ratio calibration operation in the memory system according to the third embodiment. FIG. 21 corresponds to the data B0 to B2 described in FIG. 20.

As illustrated in FIG. 21, each of the data B0 to B2 is, for example, 8-bit data, and includes information for selecting the kind of duty ratio calibration operation. That is, information that sets whether or not to execute the first duty ratio calibration operation is held in the lowest (first) bit of the data B0. Specifically, the lowest bit of the data B0 is "1" when executing the first duty ratio calibration operation, and is "0" when not executing the first duty ratio calibration operation.

In addition, information that sets whether or not to execute the duty ratio calibration operation using another circuit such as, for example, a PLL circuit is held in the second bit of the data B0. Specifically, the second bit of the data B0 is "1" when executing the duty ratio calibration operation using another circuit such as, for example, a PLL circuit, and is "0" when not executing the duty ratio calibration operation.

In addition, information that sets whether or not to execute the second duty ratio calibration operation is held in the third bit of the data B0. Specifically, the third bit of the data B0 is "1" when executing the second duty ratio calibration operation, and is "0" when not executing the second duty ratio calibration operation.

In addition, information that sets whether to execute the long-term duty ratio calibration operation or the short-term duty ratio calibration operation is held in the fourth bit of the data B0. Specifically, the fourth bit of the data B0 is "1" when executing the long-term duty ratio calibration operation, and is "0" when executing the short-term duty ratio calibration operation.

Information for selecting the kind of duty ratio calibration operation described above is associated with, for example, the signals DQ<0> to DQ<7> in order from the highest bit, and is output to the chips A to D using these signals. Further, in the example of FIG. 21, fifth to seventh bits of the data B0 and the data B1 and B2 are unused, but these bits may contain other information.

3.2 Effect of Present Embodiment

The memory system according to the third embodiment receives a set feature command, and selects the kind of duty ratio calibration operation. Thereby, by performing this setting in advance, it is possible to select whether or not to execute a duty ratio calibration operation during a read operation of data from another chip when receiving a read command. Therefore, it is possible to execute a duty ratio calibration operation without using a dedicated command "YYh" Thus, it is possible to reduce the burden on the controller 2 side.

4. Fourth Embodiment

Next, a memory system according to a fourth embodiment will be described. The memory system according to the fourth embodiment senses that the second duty ratio calibration operation has ended in a certain chip, and causes another chip to continuously execute the second duty ratio calibration operation.

Further, the memory system according to the fourth embodiment has the same configuration as the memory system according to the first embodiment. Hereinafter, the same components as those of the first embodiment will be denoted by the same reference numerals and a description thereof will be omitted, and only the portions different from the first embodiment will be described.

Figure 22:
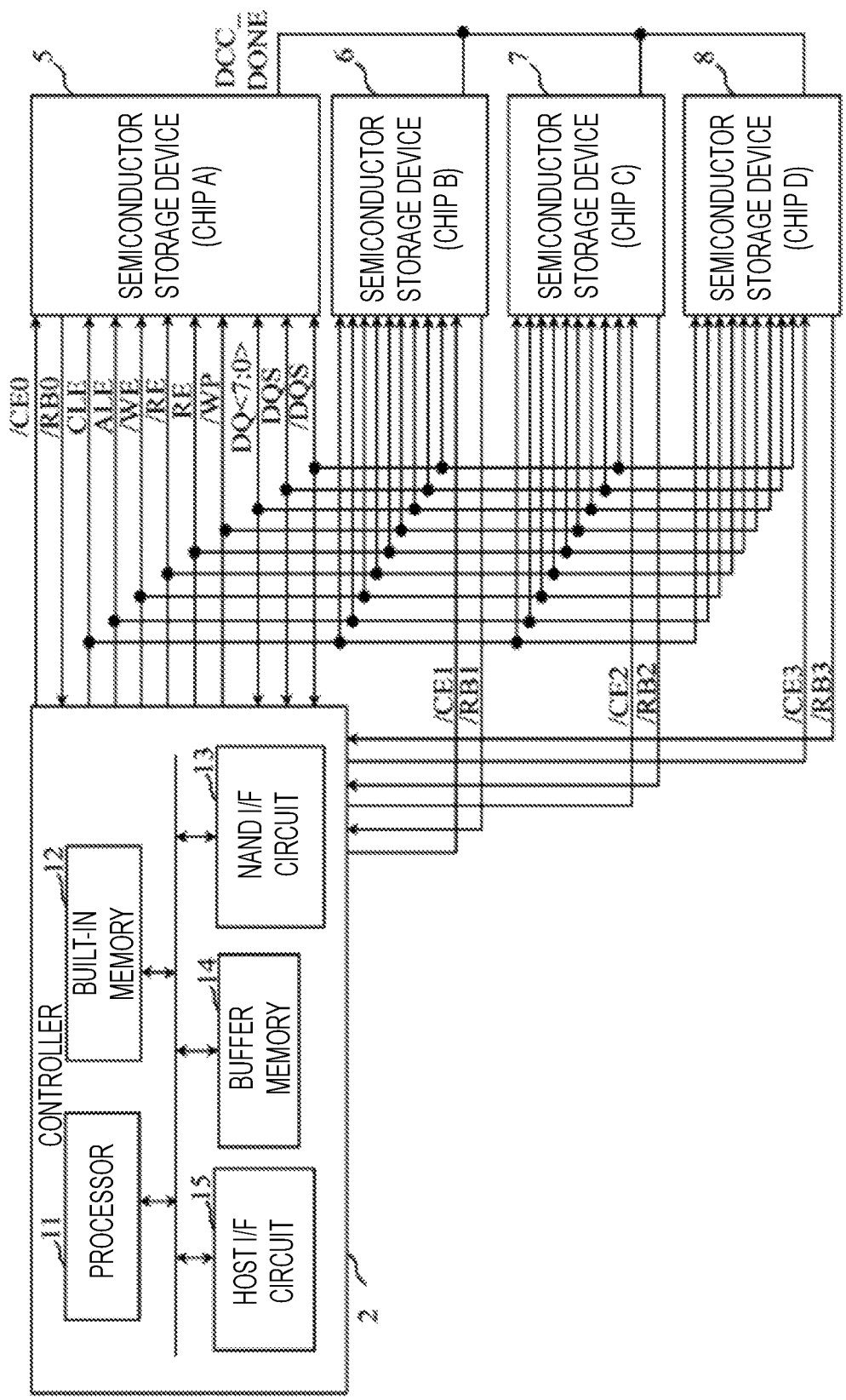
FIG. 22 is a block diagram of a signal system of a memory system according to a fourth embodiment.

4.1 About Configuration of Signal System Between Semiconductor Storage Devices A configuration of a signal system between semiconductor storage devices of the memory system according to the fourth embodiment will be described with reference to the block diagram of FIG. 22. FIG. 22 corresponds to FIG. 2 described in the first embodiment.

As illustrated in FIG. 22, the chips A to D are connected to enable transmission/reception of a signal DCC_DONE therebetween. The signal DCC_DONE is, for example, a pulse signal sent from a chip, which has completed a duty ratio calibration operation, to another chip.

4.2 About Duty Ratio Calibration Operation Executed During Another Chip Read Operation Next, the second duty ratio calibration operation in the memory system according to the fourth embodiment will be described.

Figure 23:
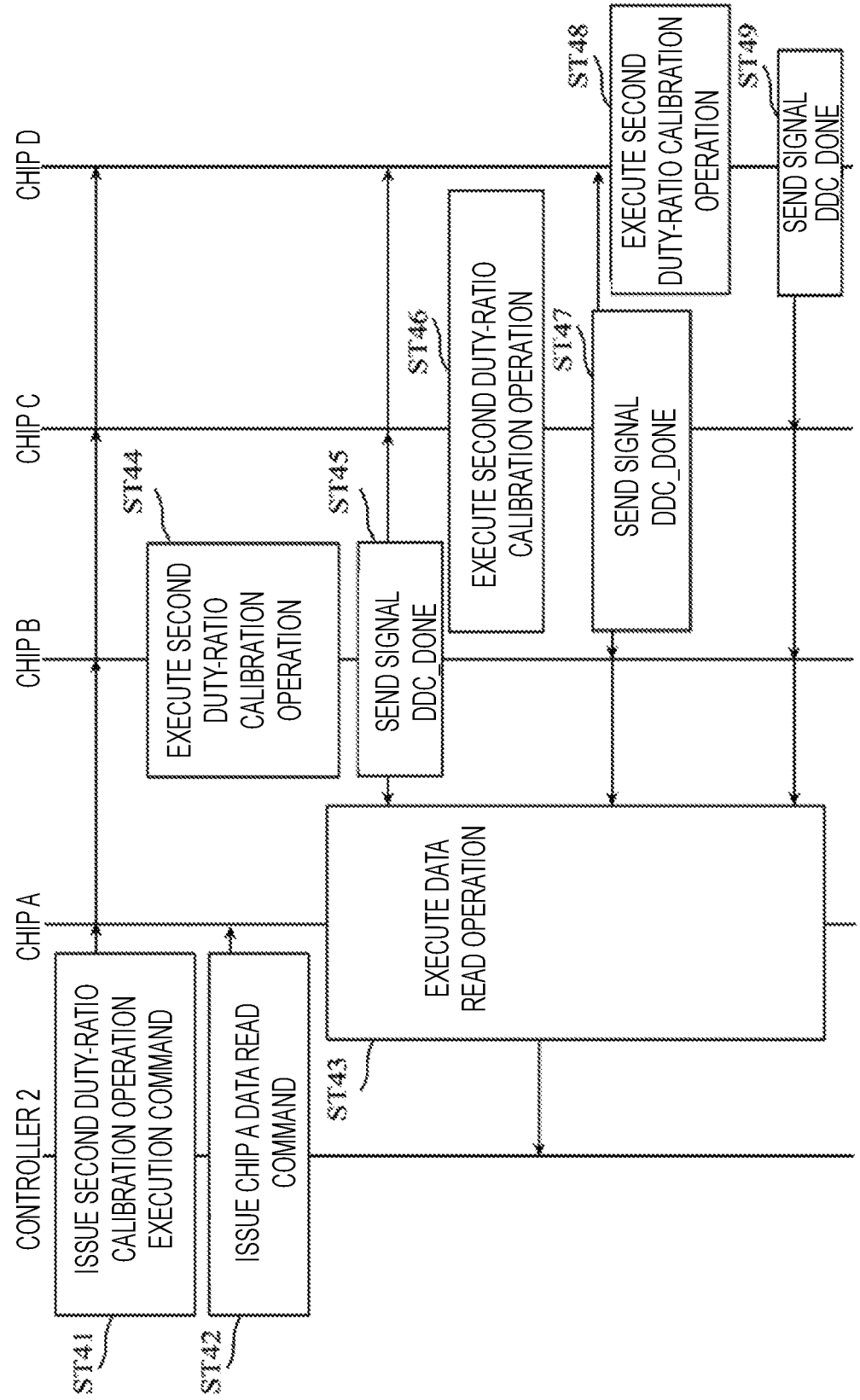
FIG. 23 is a flowchart depicting a duty ratio calibration operation executed during another chip read operation in the memory system according to the fourth embodiment.

FIG. 23 is a flowchart depicting the second duty ratio calibration operation in the memory system according to the fourth embodiment. FIG. 23 corresponds to a part of step ST3 described in FIG. 8 according to the first embodiment. Specifically, FIG. 23 illustrates a flowchart in which it is determined whether or not to continuously execute the second duty ratio calibration operation by the chips C and D, among the chips A to D, after the second duty ratio calibration operation of the chip B.

As illustrated in FIG. 23, in step ST41, the controller 2 issues a second duty ratio calibration operation execution command for the chip B to the chips A to D.

Subsequently, in step ST42, the controller 2 issues a command to read data to the chip A.

In step ST43, the chip A executes a data read operation in response to the data read command in step ST42. The following steps ST44 to ST49 are executed in parallel with step ST43.

In step ST44, the chip B executes the second duty ratio calibration operation in response to the second duty ratio calibration operation execution command in step ST41, in parallel with step ST43.

When the second duty ratio calibration operation ends, in step ST45, the chip B sends the signal DCC_DONE to the other chips A, C, and D.

In step ST46, the chip C determines that a next calibration operation target is the chip C based on the signal DCC_DONE sent once in step ST45, and executes the second duty ratio calibration operation in parallel with step ST43.

When the second duty ratio calibration operation ends, in step ST47, the chip C sends the signal DCC_DONE to the other chips A, B, and D.

In step ST48, the chip D determines that a next calibration operation target is the chip D based on the signal DCC_DONE sent twice in steps ST45 and ST47, and executes the second duty ratio calibration operation in parallel with step ST43.

When the second duty ratio calibration operation ends, in step ST49, the chip D sends a calibration operation end pulse to the other chips A to C.

By operating as described above, the second duty ratio calibration operation for the chips B to D, excluding the chip A, ends.

Further, the chips A to D may share in advance information regarding which order the second duty ratio calibration operation is executed. For example, when the chip B first receives a command to execute the second duty ratio calibration operation, the chip C may recognize that the chip C is a next calibration operation target when receiving the signal DCC_DONE once. In addition, the chip D may recognize that the chip D is a next calibration operation target when receiving the signal DCC_DONE twice.

Figure 24:
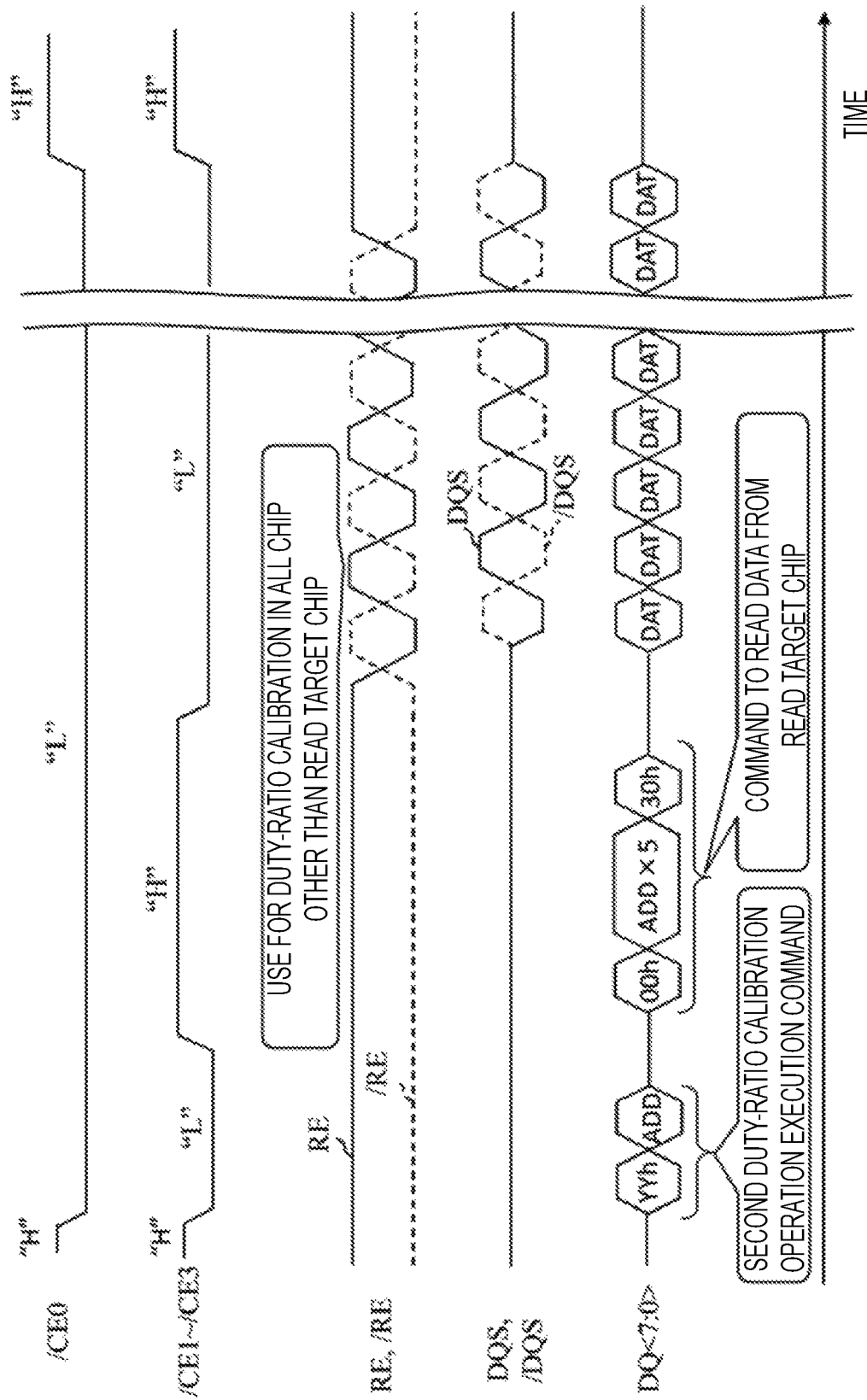
FIG. 24 is a command sequence for the duty ratio calibration operation executed during another chip read operation in the memory system according to the fourth embodiment.

FIG. 24 is a command sequence for the second duty ratio calibration operation in the memory system according to the fourth embodiment. FIG. 24 corresponds to steps ST41 to ST49 described in FIG. 23.

As illustrated in FIG. 24, the controller 2 sets the signals /CE0 to /CE3 to the "L" level to enable the chips A to D.

The controller 2 issues a command "YYh", and transmits the same to the chips A to D. Subsequently, the controller 2 issues an address ADD, for example, over one cycle, and transmits the same to the chips A to D. The address ADD designates, for example, the chip address of the chip, which first executes the second duty ratio calibration operation, among the chips A to D. That is, in the example of FIG. 24, the chip address of the chip B is designated as the address ADD.

Subsequently, the controller 2 sets the signals /CE1 to /CE3 to the "H" level to enable the chip B.

The controller 2 issues a first read command "00h", and subsequently issues an address ADD, for example, over five cycles. Thereafter, the controller 2 issues a second read command "30h".

When the command "30h" is stored in the register 26 of the chip A, the sequencer 27 of the chip A controls, for example, the voltage generation circuit 28, the driver set 29, the row decoder 30, and the sense amplifier 31 to start a read operation.

Subsequently, the controller 2 sets the signals /CE1 to /CE 3 to the "L" level again to enable the chips B to D, and thereafter asserts the signals RE and /RE repeatedly and alternately. Whenever the signals RE and /RE are toggled, data read from the memory cell array 21 of the chip A is transmitted to the controller 2.

In addition, in parallel with a read operation of data from the chip A, the sequencer 27 of each of the chips B to D controls, for example, the input/output circuit 22 and the logic control circuit 24 based on the signals RE and /RE to start the second duty ratio calibration operation.

When the read operation in the chip A and the second duty ratio calibration operation in each of the chips B to D end, the controller 2 sets the signals /CE0 to /CE 3 to the "H" level to disenable the chips A to D.

By operating as described above, the second duty ratio calibration operation for the chips B to D ends.

4.3 Effects of Present Embodiment

According to the memory system of the fourth embodiment, the chips B to D simultaneously receive a command "YYh" from the controller 2. The chips B to D execute the second duty ratio calibration operation based on a predetermined order, and send the signal DCC_DONE to another chip when the calibration operation ends. The other chip determines whether or not the corresponding chip is a next calibration target chip based on the number of times the signal DCC_DONE is received. When the determined result is that the corresponding chip is a next calibration target chip, the corresponding chip subsequently executes the second duty ratio calibration operation during the read operation of the chip A.

Thereby, when the time required for the second duty ratio calibration operation is shorter than the time required for the read operation, the second duty ratio calibration operation may be executed by a plurality of chips during a single read operation.

5. Modification and the Like

The embodiments are not limited to forms described in the above first to fourth embodiments, and various modifications are possible. For example, in the above-described first to fourth embodiments, the second duty ratio calibration operation may be executed when various conditions are satisfied.

In the following description, the same components as those in the first embodiment will be denoted by the same reference numerals and a description thereof will be omitted, and only the portions different from the first embodiment will be described.

5.1 First Modification

Figure 25:
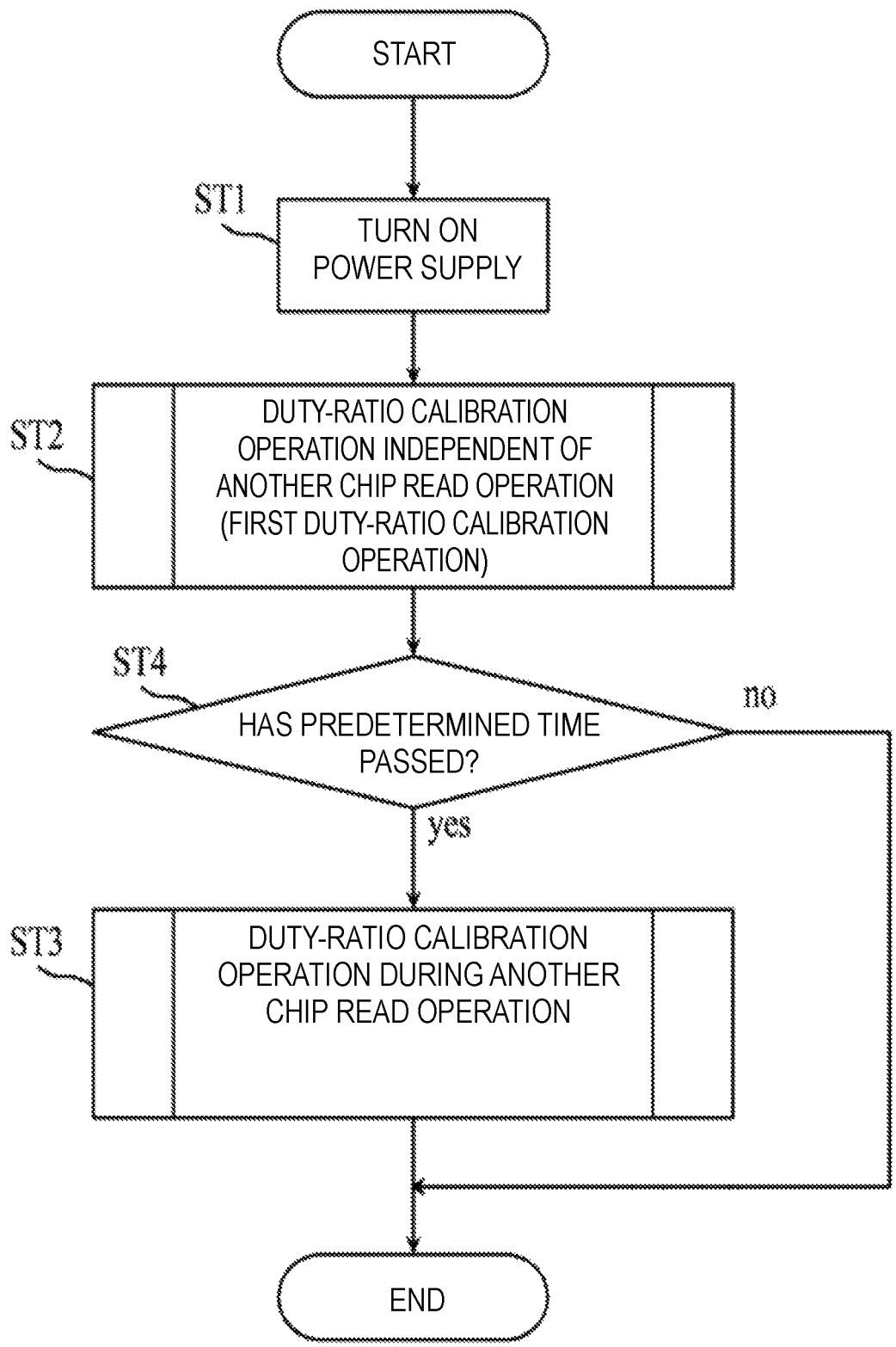
FIG. 25 is a flowchart depicting a duty ratio calibration operation in a memory system according to a first modification.

FIG. 25 is a flowchart depicting a duty ratio calibration operation in a memory system according to a first modification. Steps ST1 to ST3 illustrated in FIG. 25 are the same as, for example, steps ST1 to ST3 in FIG. 8 described in the first embodiment.

As illustrated in FIG. 25, in step ST4, the controller monitors the elapsed time from the first duty ratio calibration operation executed in step ST2, and determines whether or not the elapsed time is equal to or greater than a predetermined threshold. When the elapsed time from the first duty ratio calibration operation is equal to or greater than the predetermined threshold (step ST4; yes), the memory system 1 proceeds to step ST3, and executes the second duty ratio calibration operation. When the elapsed time from the first duty ratio calibration operation is less than the predetermined threshold (step ST4: no), the memory system 1 ends the duty ratio calibration operation without executing the second duty ratio calibration operation.

By operating as described above, it is possible to suppress execution of the duty ratio calibration operation in a case where a sufficient time has not elapsed after the duty ratio was calibrated, and the duty ratio has not changed significantly. In addition, when it is considered that the duty ratio has changed significantly due to a fact that a sufficient time has elapsed, it is possible to properly execute the duty ratio calibration operation. Thus, it is possible to properly manage the frequency, at which the operation is executed in the memory system 1, and to reduce power consumption.

In addition, in the first modification described above, a case where the controller 2 monitors the elapsed time after execution of the first duty ratio calibration operation has been described, but the disclosure is not limited thereto. For example, the controller 2 may also monitor the elapsed time after execution of the second duty ratio calibration operation in the same manner, and may determine whether or not further execution of the second duty ratio calibration operation is necessary. In other words, the controller 2 may monitor the elapsed time after a previous calibration operation was executed.

5.2 Second Modification

Figure 26:
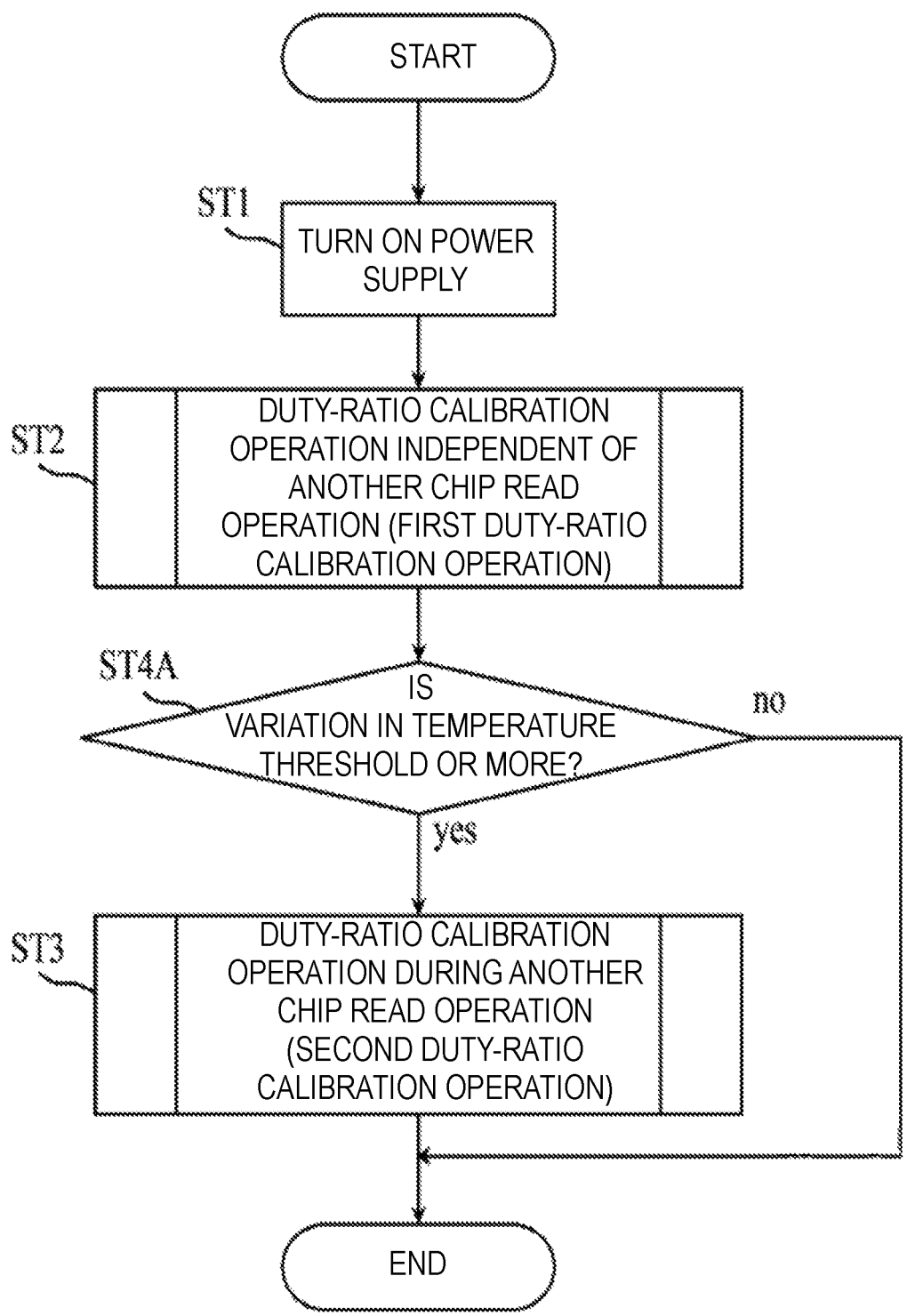
FIG. 26 is a flowchart depicting a duty ratio calibration operation in a memory system according to a second modification.

FIG. 26 is a flowchart depicting a duty ratio calibration operation in a memory system according to a second modification. Steps ST1 to ST3 illustrated in FIG. 26 are equal to, for example, steps ST1 to ST3 in FIG. 8 described in the first embodiment.

As illustrated in FIG. 26, in step ST4A, the controller 2 monitors the temperature of each of the chips A to D, and determines whether or not the amount of variation in temperature from the time of first duty ratio calibration operation in step ST2 is equal to or greater than a predetermined threshold. The controller 2 may monitor the amount of variation in temperature by periodically acquiring temperature information on the temperature measured by the temperature sensors 25 in each of the chips A to D, for example. When the amount of variation in temperature is equal to or greater than the predetermined threshold (step ST4A; yes), the memory system 1 proceeds to step ST3, and executes the second duty ratio calibration operation. When the amount of variation in temperature is less than the predetermined threshold (step ST4A; no), the memory system 1 ends the duty ratio calibration operation without executing the second duty ratio calibration operation.

By operating as described above, it is possible to prevent the execution of the duty ratio calibration operation when the amount of variation in temperature, which is one of factors of changing the duty ratio, is small. In addition, when it is considered that the duty ratio has significantly changed due to a large change in the temperature inside the chip, it is possible to properly execute the duty ratio calibration operation. Thus, it is possible to properly manage the frequency, at which the operation is executed in the memory system 1, and to reduce power consumption.

In addition, in the second modification described above, a case where the controller 2 monitors the amount of variation in temperature from the time of the first duty ratio calibration operation has been described, but the disclosure is not limited thereto. For example, the controller 2 may also monitor the amount of variation in temperature from the time of the second duty ratio calibration operation in the same manner, and may determine whether or not further execution of the second duty ratio calibration operation is necessary. That is, the controller 2 may monitor the amount of variation in temperature after a previous calibration operation.

In addition, in the second modification described above, a case where the controller 2 monitors the temperature in each of the chips A to D has been described, but the disclosure is not limited thereto. For example, when the controller 2 and the NAND package 3 are provided in the same package, there is a possibility that the temperature in the same package may be regarded as being substantially constant regardless of the measurement position thereof. In such a case, the controller 2 may execute step ST4A based on information measured by a temperature sensor (not illustrated) provided at any position in the same package without being limited to the temperature sensor 25 in each of the chips A to D.

5.3 Third Modification

Figure 27:
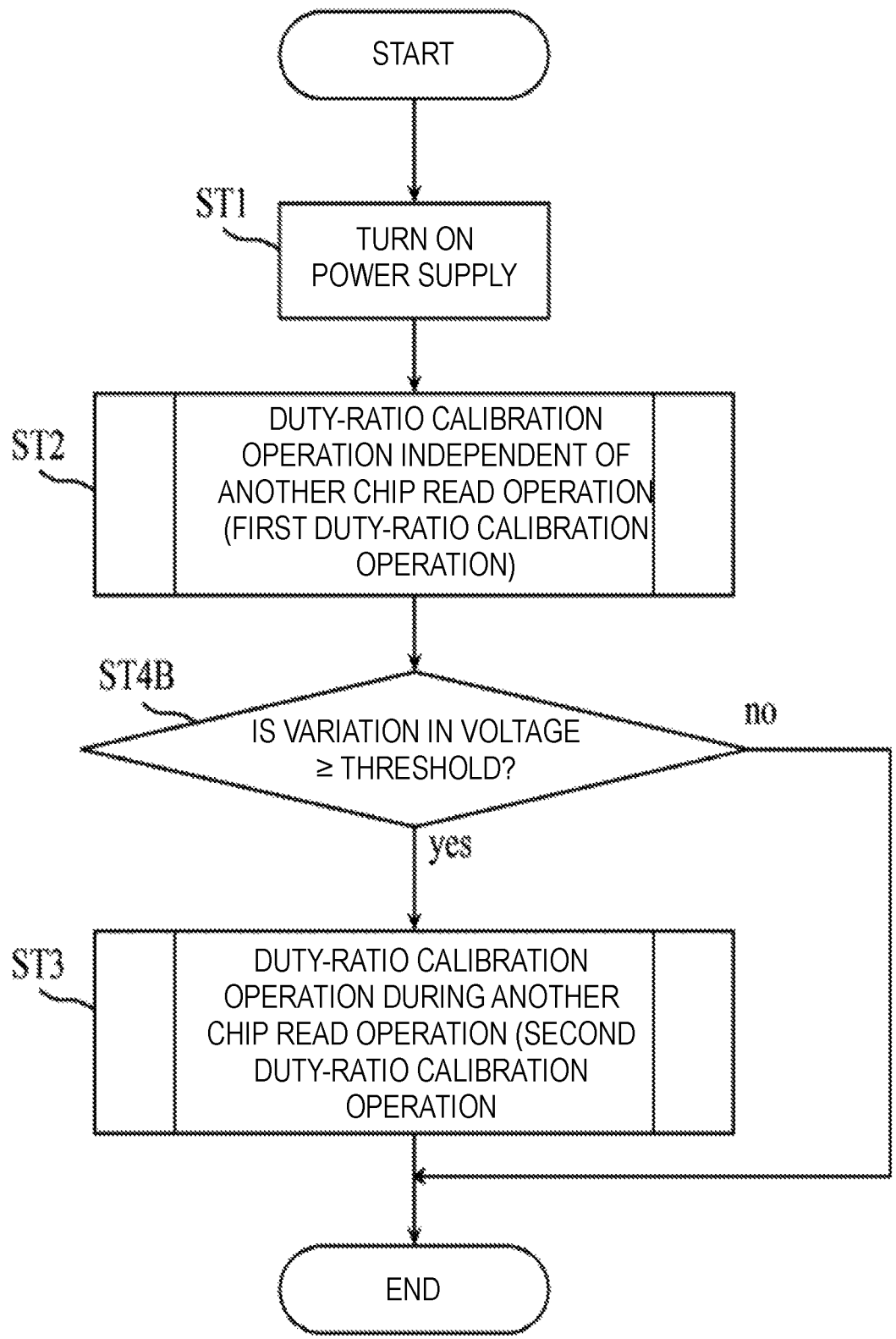
FIG. 27 is a flowchart depicting a duty ratio calibration operation in a memory system according to a third modification.

FIG. 27 is a flowchart depicting a duty ratio calibration operation in a memory system according to a third modification. Steps ST1 to ST3 illustrated in FIG. 27 are equal to steps ST1 to ST3 in FIG. 8 described in the first embodiment, for example.

As illustrated in FIG. 27, in step ST4B, the controller 2 monitors the voltage VCCQ supplied from the power manager 4, and determines whether or not the amount of variation in the voltage VCCQ from the time of execution of the first duty ratio calibration operation in step ST2 is equal to or greater than a predetermined threshold. When the amount of variation in the voltage VCCQ is equal to or greater than the predetermined threshold (step ST4B; yes), the memory system 1 proceeds to step ST3, and executes the second duty ratio calibration operation. When the amount of variation in the voltage VCCQ is less than the predetermined threshold (step ST4B; no), the memory system 1 ends the duty ratio calibration operation without executing the second duty ratio calibration operation.

By operating as described above, when the amount of variation in the voltage VCCQ, which is one of factors of changing the duty ratio, is small, it is possible to prevent execution of the duty ratio calibration operation. In addition, when it is considered that the duty ratio has significantly changed due to a large change in the voltage VCCQ supplied to the controller 2 and the NAND package 3, it is possible to properly execute the duty ratio calibration operation. Therefore, it is possible to properly manage the frequency, at which the operation is executed in the memory system 1, and to reduce power consumption.

In addition, in the third modification described above, a case where the controller 2 monitors the amount of variation in the voltage VCCQ from the time of execution of the first duty ratio calibration operation is described, but the disclosure is not limited thereto. For example, the controller 2 may monitor the amount of variation in the voltage VCCQ from the time of execution of the second duty ratio calibration operation in the same manner, and may determine whether or not further execution of the second duty ratio calibration operation is necessary. That is, the controller 2 may monitor the amount of variation in the voltage VCCQ after a previous calibration operation.

In addition, in the third modification described above, a case where the amount of variation in the voltage VCCQ supplied to the controller 2 is monitored has been described, but the disclosure is not limited thereto. For example, the controller 2 may monitor the amount of variation in the voltage VCCQ supplied to the NAND package 3. In addition, the controller 2 may monitor the voltage VCC supplied to the NAND package 3.

5.4 Fourth Modification

Figure 28:
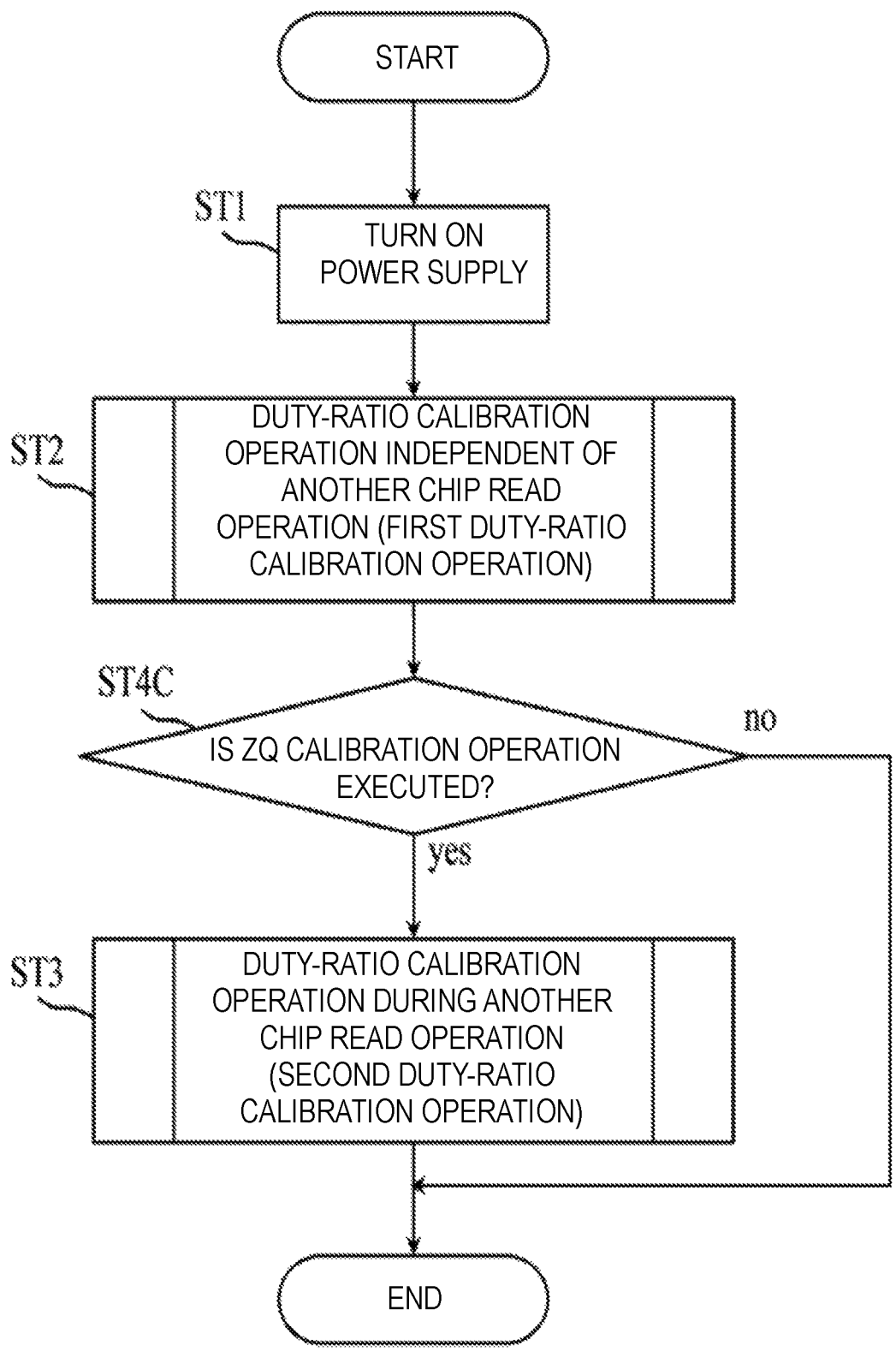
FIG. 28 is a flowchart depicting a duty ratio calibration operation in a memory system according to a fourth modification.

FIG. 28 is a flowchart depicting a duty ratio calibration operation in a memory system according to a fourth modification. Steps ST1 to ST3 illustrated in FIG. 28 are, for example, equal to steps ST1 to ST3 in FIG. 8 described in the first embodiment.

As illustrated in FIG. 28, in step ST4C, the controller 2 determines whether or not an output impedance calibration operation using the ZQ calibration circuit 23 has been executed for each of the chips A to D. When the output impedance calibration operation is executed (step ST4C; yes), the memory system 1 proceeds to step ST3, and executes the second duty ratio calibration operation. When the output impedance calibration operation has not been executed (step ST4C; no), the memory system 1 ends the duty ratio calibration operation without executing the second duty ratio calibration operation.

By operating as described above, it is possible to execute the duty ratio calibration operation in conjunction with the output impedance calibration operation. Generally, there is a possibility that factors of changing the duty ratio overlap factors of changing the output impedance. Therefore, when calibration of the output impedance is necessary, there is a possibility that the duty ratio also changes to such a degree that calibration is necessary. Therefore, it is possible to properly manage the frequency, at which the operation is executed in the memory system 1, and to reduce power consumption.

5.5 Fifth Modification

Figure 29:
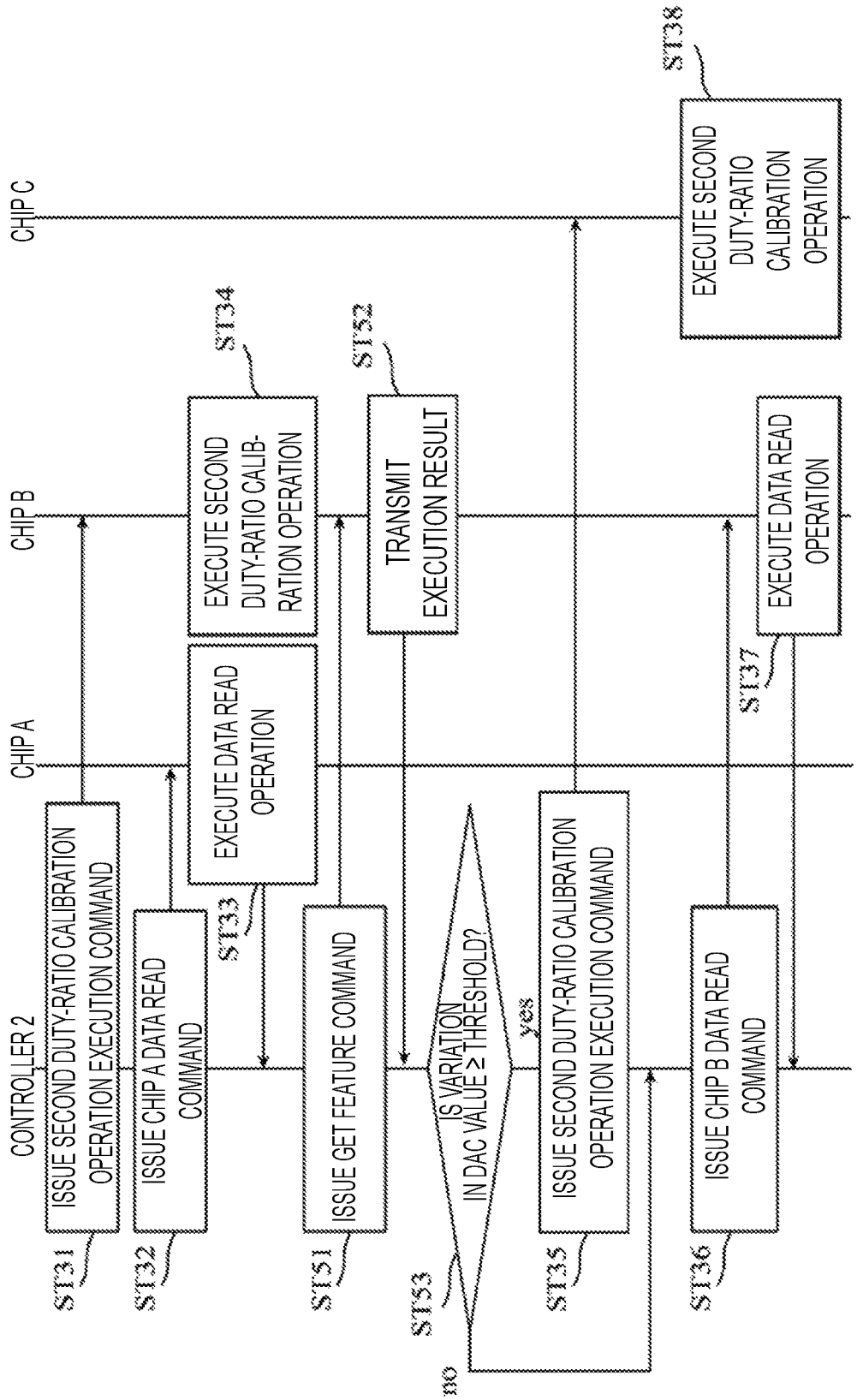
FIG. 29 is a flowchart depicting a duty ratio calibration operation executed during another chip read operation in a memory system according to a fifth modification.

FIG. 29 is a flowchart depicting a second duty ratio calibration operation in a memory system according to a fifth modification. FIG. 29 corresponds to FIG. 12 described in the first embodiment. In FIG. 29, in addition to steps ST31 to ST38 in FIG. 12, steps ST51 to ST53 are further added between step ST34 and step ST35.

As illustrated in FIG. 29, after the chip B executes the second duty ratio calibration operation in step ST34, in step ST51, the controller 2 issues a get feature command to collect the execution result of the second duty ratio calibration operation to the chip B.

In step ST52, the chip B transmits the execution result of the second duty ratio calibration operation executed in step ST34 to the controller 2 in response to the get feature command in step ST51.

In step ST53, the controller 2 determines, based on the execution result from the chip B, whether or not the DAC value of the control signals DAC1 and DAC2 has varied by a predetermined threshold or more by the second duty ratio calibration operation in the chip B. When variation in the DAC value of the control signals DAC1 and DAC2 in the chip B is the predetermined threshold or more (step ST53; yes), the controller 2 proceeds to step ST35. In this case, the following steps ST36 to ST38 are executed in the same manner as steps ST36 to ST38 in FIG. 12.

On the other hand, when variation in the DAC value of the control signals DAC1 and DAC2 in the chip B is less than the predetermined threshold (step ST53; no), the controller 2 proceeds to step ST36 without executing step ST35. In this case, in step ST36, the controller 2 issues a command to read data from the chip B, and in step ST37, the chip B executes a data read operation in response to the data read command in step ST36. However, since the chip C has received no second duty ratio calibration operation execution command, the chip C does not execute step ST38 during the read operation in step ST37.

By operating as described above, when a change in duty ratio is not observed in one chip, it is considered that there is a low possibility that a change in duty ratio is occurring in the other chips, and it is possible to prevent execution of an unnecessary operation. In addition, when the duty ratio has changed in one chip, it is considered that there is a high possibility that a change in duty ratio is also occurring in the other chips, and it is possible to properly execute the duty ratio calibration operation. Thus, it is possible to properly manage the frequency, at which the operation is executed in the memory system 1, and to reduce power consumption.

Figure 30:
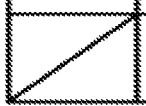
FIG. 30 is a table for explaining information on a calibration result of the duty ratio calibration operation in the memory system according to the fifth modification.

FIG. 30 is a table for explaining a get feature operation in a memory system according to a sixth modification.

As illustrated in FIG. 30, data DAT is, for example, 8-bit data, and includes information that is sent as the execution result of the duty ratio calibration operation. That is, information for determining whether or not the duty ratio calibration operation has been completed is held in the lowest (first) bit of the data DAT. Specifically, the lowest bit of the data DAT is "1" when the duty ratio calibration operation is completed, and is "0" when the duty ratio calibration operation is not completed.

In addition, information for determining whether or not the DAC value of the control signals DAC1 and DAC2 has changed by a threshold or more before and after the duty ratio calibration operation is held in the second bit of the data DAT. Specifically, the second bit of the data DAT is "1" when the amount of variation in the DAC value is the threshold or more, and is "0" when the amount of variation in the DAC value is less than the threshold.

Information that is sent as the execution result of the above-described duty ratio calibration operation is associated with the signals DQ<0> to DQ<7> in order from the highest bit, for example, and is output to the controller 2 using these signals. In addition, in the example of FIG. 30, third to seventh bits (DQ<5:0>) of the data DAT are unused, but other information may be included in these bits.

5.6 Sixth Modification

Figure 31:
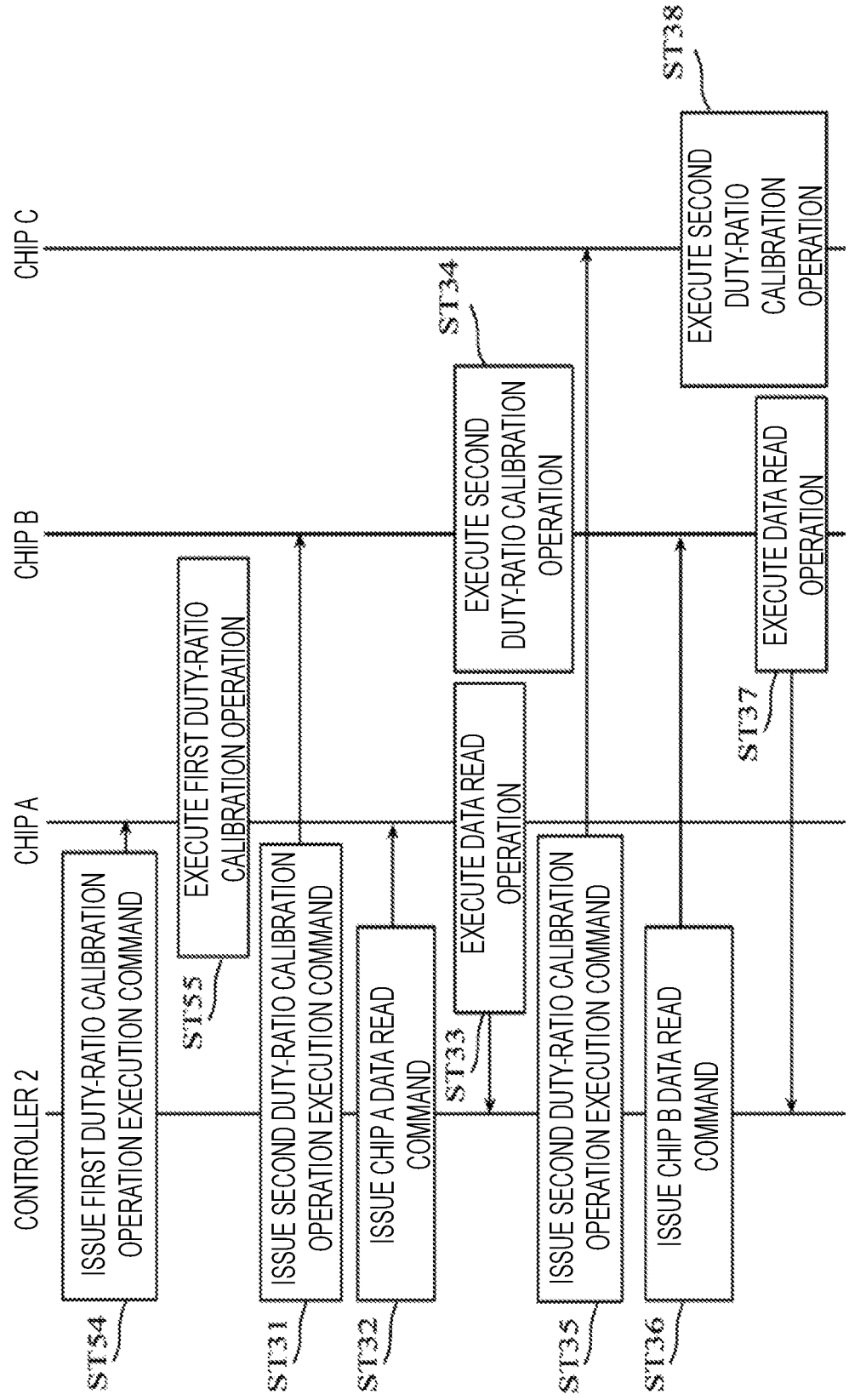
FIG. 31 is a flowchart depicting a duty ratio calibration operation executed during another chip read operation in a memory system according to a sixth modification.

FIG. 31 is a flowchart depicting a duty ratio calibration operation in a memory system according to a sixth modification. FIG. 31 corresponds to FIG. 12 described in the first embodiment. In FIG. 31, in addition to steps ST31 to ST38 in FIG. 12, steps ST54 and ST55 are further added before step ST31.

As illustrated in FIG. 31, before step ST31 is executed, in step ST54, the controller 2 issues a first duty ratio calibration operation execution command to chip A. In step ST55, the chip A executes the first duty ratio calibration operation.

The operations of steps ST31 to ST38 are equal to those in FIG. 12, and thus, a description thereof will be omitted.

By operating as described above, the first duty ratio calibration operation is executed on the chip A, from which data is first read, before data is read out. Thereby, with respect to the chip A, it is also possible to read data in a state where the duty ratio has been properly calibrated. Thus, a read operation of data from all of the chips may be executed based on an appropriate duty ratio.

6. Others

In addition, in the embodiments, the following modifications are applicable as appropriate.

For example, in the first to third embodiments and the first to sixth modifications described above, a case where the duty ratio is calibrated to 50% has been described. However, a target duty ratio is not limited to 50%, and may be set to any value.

In addition, in the first to third embodiments and the first to sixth modifications, a case where the first duty ratio calibration operation and the second duty ratio calibration operation are executed for each chip has been described. However, the disclosure is not limited thereto, and the first duty ratio calibration operation and the second duty ratio calibration operation may be executed in parallel on a plurality of chips.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell;
   a first pad through which an output instruction signal is to be received;
   a second pad through which a data signal is to be output;
   a third pad through which a strobe signal is to be output; and
   a control circuit, wherein
   upon receiving a read command, the control circuit executes a read operation on the memory cell, and outputs the data signal in synchronization with the strobe signal in response to the output instruction signal, and
   upon receiving a first command that is different from the read command, the control circuit executes a first calibration operation to calibrate a duty ratio of the strobe signal in response to the output instruction signal while data is read out from another semiconductor storage device in response to the output instruction signal.

2. The semiconductor storage device according to claim 1, wherein the output instruction signal is a toggle signal that periodically toggles between a high level and a low level, and the semiconductor storage device further comprises:
   a detection circuit configured to detect the duty ratio of the strobe signal; and
   a correction circuit configured to correct the duty ratio of the strobe signal based on the duty ratio detected by the detection circuit.

3. The semiconductor storage device according to claim 1, wherein, upon receiving a second command that is different from the read command and the first command, the control circuit executes a second calibration operation to calibrate the duty ratio of the strobe signal while the another semiconductor device is not enabled.

4. The semiconductor storage device according to claim 3, wherein the first calibration operation and the second calibration operation have different times required for calibration of the duty ratio.

5. The semiconductor storage device according to claim 3, wherein the first calibration operation and the second calibration operation have different calibration accuracies of the duty ratio.

6. The semiconductor storage device according to claim 1, wherein, upon receiving the first command, the control circuit executes the first calibration operation to calibrate the duty ratio of the strobe signal while data is read out from the another semiconductor storage device in response to the output instruction signal, and a third semiconductor storage device executes a third calibration operation to calibrate a duty ratio of a strobe signal in the third semiconductor storage device in response to the output instruction signal .

7. The semiconductor storage device according to claim 6, wherein the third semiconductor storage device executes the third calibration operation after the semiconductor storage device completes execution of the first calibration operation.

8. The semiconductor storage device according to claim 7, wherein the semiconductor storage device transmits a signal to the third semiconductor storage device indicating completion of the first calibration operation.

9. A memory system comprising:
a controller device; and
a first memory chip and a second memory chip each including a memory cell, the first and second memory chips being connected to the controller device to receive therefrom an output instruction signal, wherein
upon receiving a first command from the controller device at the first memory chip and receiving a read command different from the first command from the controller device at the second memory chip thereafter, the first memory chip executes a first calibration operation to calibrate a duty ratio of a strobe signal in response to the output instruction signal while data is read out from the second memory chip in response to the output instruction signal.

10. The memory system according to claim 9, wherein, upon the first memory chip receiving a second command from the controller device, the first memory chip executes a second calibration operation to calibrate the duty ratio of the strobe signal while the second memory chip is not enabled.

11. The memory system according to claim 10, wherein the controller device monitors an elapsed time after issuance of the first command or the second command, and issues another first command when the elapsed time exceeds a predetermined threshold.

12. The memory system according to claim 10, wherein the controller device monitors a temperature in the memory system, and issues the first command when the temperature has changed by at least a predetermined threshold after the most recently issued first or second command.

13. The memory system according to claim 10, wherein the controller device monitors a voltage supplied to the controller device and the semiconductor storage device, and issues the first command when the voltage has changed by at least a predetermined threshold after the most recently issued first or second command.

14. The memory system according to claim 9, wherein the controller device monitors whether or not an output impedance of the first memory chip or the second memory chip has been calibrated, and issues the first command when the output impedance has been calibrated.

15. The memory system according to claim 9, wherein the controller device monitors an amount of variation in the duty ratio of the first memory chip in the first calibration operation, and issues the first command to the second memory chip when the amount of variation in the duty ratio of the first memory chip is greater than or equal to a predetermined threshold.

16. The memory system according to claim 9, further comprising:
a third memory chip including a memory cell configured to hold data, the third memory chip being configured to receive the output instruction signal together with the first memory chip and the second memory chip,
wherein, in a case where the third memory chip also receives the first command, the first memory chip executes the first calibration operation and the third memory chip executes a third calibration operation to calibrate a duty ratio of a strobe signal in the third memory chip in response to the output instruction signal while data is read out from the second memory chip in response to the output instruction signal.

17. The memory system according to claim 16, wherein the third memory chip executes the third calibration operation after the first memory chip completes execution of the first calibration operation.

18. A memory system comprising:
a controller device; and
a first memory chip and a second memory chip each including a memory cell, the first and second memory chips being connected to the controller device to receive therefrom an output instruction signal, wherein
the first memory chip stores first calibration information in response to a first set feature command from the controller device, so that the first memory chip is configured to execute a first calibration operation to calibrate a duty ratio of a strobe signal in response to the output instruction signal while data is read out from the second memory chip in response to the output instruction signal.

19. The memory system according to claim 18, wherein the first memory chip stores second calibration information in response to a second set feature command from the controller device, so that the first memory chip is configured to not execute any calibration operation while data is read out from the second memory chip in response to the output instruction signal.

20. The memory system according to claim 18, wherein the first memory chip further comprises:
a detection circuit configured to detect the duty ratio of the strobe signal;
a sequencer configured to generate a control signal based on the duty ratio detected by the detection circuit; and
a correction circuit configured to generate a correction signal that causes a duty ratio of the output instruction signal to be corrected.

* * * * *